(12) United States Patent
Su et al.

(10) Patent No.: US 8,320,134 B2
(45) Date of Patent: Nov. 27, 2012

(54) EMBEDDED COMPONENT SUBSTRATE AND MANUFACTURING METHODS THEREOF

(75) Inventors: Yuan-Chang Su, Taoyuan County (TW); Shih-Fu Huang, Hsinchu County (TW); Ming-Chiang Lee, Kaohsiung (TW); Chien-Hao Wang, Hukou Township, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 225 days.

(21) Appl. No.: 12/701,486

(22) Filed: Feb. 5, 2010

(65) Prior Publication Data

US 2011/0194265 A1    Aug. 11, 2011

(51) Int. Cl.
*H05K 1/18* (2006.01)
(52) U.S. Cl. ......... 361/761; 174/262; 174/265; 361/764
(58) Field of Classification Search .......... 174/260–262, 174/265; 361/761, 762, 764, 783
See application file for complete search history.

(56) References Cited

U.S. PATENT DOCUMENTS

| | | | |
|---|---|---|---|
| 3,903,590 A | 9/1975 | Yokogawa | |
| 3,959,874 A | 6/1976 | Coucoulas | |
| 4,783,695 A | 11/1988 | Eichelberger et al. | |
| 4,866,501 A | 9/1989 | Shanefield | |
| 5,019,535 A | 5/1991 | Wojnarowski et al. | |
| 5,091,769 A | 2/1992 | Eichelberger | |
| 5,111,278 A | 5/1992 | Eichelberger | |
| 5,120,678 A | 6/1992 | Moore et al. | |
| 5,149,662 A | 9/1992 | Eichelberger | |
| 5,151,776 A | 9/1992 | Wojnarowski et al. | |
| 5,157,589 A | 10/1992 | Cole, Jr. et al. | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |

(Continued)

FOREIGN PATENT DOCUMENTS

JP    2004007006    1/2004

(Continued)

OTHER PUBLICATIONS

Imbera, "IMB Technology". available at http://www.imberacorp.com/imb-technology (brief printable download). Imbera Corporation, Melbourne, FL.

(Continued)

*Primary Examiner* — Hoa C Nguyen
(74) *Attorney, Agent, or Firm* — Foley & Lardner LLP

(57) ABSTRACT

An embodiment of an embedded component substrate includes: (1) a semiconductor device including lower, lateral, and upper surfaces; (2) a first patterned conductive layer including a first electrical interconnect extending substantially laterally within the first patterned conductive layer; (3) a second electrical interconnect extending substantially vertically from a first surface of the first interconnect, and including lateral and upper surfaces, and a lower surface adjacent to the first surface; (4) a dielectric layer including an opening extending from an upper surface of the dielectric layer to a lower surface of the dielectric layer, where: (a) the dielectric layer substantially covers the lateral and upper surfaces of the device, and at least a portion of the lateral surface of the second interconnect; and (b) the second interconnect substantially fills the opening; and (5) a second patterned conductive layer adjacent to the upper surfaces of the dielectric layer and the second interconnect.

20 Claims, 15 Drawing Sheets

U.S. PATENT DOCUMENTS

| | | | |
|---|---|---|---|
| 5,324,687 A | 6/1994 | Wojnarowski | |
| 5,353,195 A | 10/1994 | Fillion et al. | |
| 5,353,498 A | 10/1994 | Fillion et al. | |
| 5,422,513 A | 6/1995 | Marcinkiewicz et al. | |
| 5,432,677 A | 7/1995 | Mowatt et al. | |
| 5,497,033 A | 3/1996 | Fillion et al. | |
| 5,519,936 A | 5/1996 | Andros et al. | |
| 5,527,741 A | 6/1996 | Cole et al. | |
| 5,546,654 A | 8/1996 | Wojnarowski et al. | |
| 5,554,887 A | 9/1996 | Sawai et al. | |
| 5,565,706 A | 10/1996 | Miura et al. | |
| 5,567,656 A | 10/1996 | Chun | |
| 5,703,400 A | 12/1997 | Wojnarowski et al. | |
| 5,710,062 A | 1/1998 | Sawai et al. | |
| 5,745,984 A | 5/1998 | Cole, Jr. et al. | |
| 5,834,340 A | 11/1998 | Sawai et al. | |
| 5,841,190 A | 11/1998 | Noda et al. | |
| 5,841,193 A | 11/1998 | Eichelberger | |
| 5,866,952 A | 2/1999 | Wojnarowski et al. | |
| 5,945,741 A | 8/1999 | Ohsawa et al. | |
| 6,046,071 A | 4/2000 | Sawai et al. | |
| 6,080,932 A | 6/2000 | Smith et al. | |
| 6,110,608 A | 8/2000 | Tanimoto et al. | |
| 6,159,767 A | 12/2000 | Eichelberger | |
| 6,232,151 B1 | 5/2001 | Ozmat et al. | |
| 6,239,482 B1 | 5/2001 | Fillion et al. | |
| 6,265,765 B1 | 7/2001 | DiStefano et al. | |
| 6,278,181 B1 | 8/2001 | Maley | |
| 6,294,741 B1 | 9/2001 | Cole, Jr. et al. | |
| 6,306,680 B1 | 10/2001 | Fillion et al. | |
| 6,358,780 B1 | 3/2002 | Smith et al. | |
| 6,377,461 B1 | 4/2002 | Ozmat et al. | |
| 6,396,148 B1 | 5/2002 | Eichelberger et al. | |
| 6,400,573 B1 | 6/2002 | Mowatt et al. | |
| 6,423,570 B1 | 7/2002 | Ma et al. | |
| 6,426,545 B1 | 7/2002 | Eichelberger et al. | |
| 6,452,258 B1 | 9/2002 | Abys et al. | |
| 6,486,006 B2 | 11/2002 | Hirano et al. | |
| 6,555,906 B2 | 4/2003 | Wermer et al. | |
| 6,555,908 B1 | 4/2003 | Eichelberger et al. | |
| 6,586,822 B1 | 7/2003 | Vu et al. | |
| 6,590,291 B2 | 7/2003 | Akagawa | |
| 6,639,324 B1 | 10/2003 | Chien | |
| 6,680,529 B2 | 1/2004 | Chen et al. | |
| 6,701,614 B2 | 3/2004 | Ding et al. | |
| 6,724,638 B1 | 4/2004 | Inagaki et al. | |
| 6,734,534 B1 | 5/2004 | Vu et al. | |
| 6,734,542 B2 | 5/2004 | Nakatani et al. | |
| 6,759,268 B2 | 7/2004 | Akagawa | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,849,945 B2 | 2/2005 | Horiuchi et al. | |
| 6,865,089 B2 | 3/2005 | Ho et al. | |
| 6,872,893 B2 | 3/2005 | Fukuoka et al. | |
| 6,876,544 B2 | 4/2005 | Hsin | |
| 6,894,399 B2 | 5/2005 | Vu et al. | |
| 6,902,950 B2 | 6/2005 | Ma et al. | |
| 6,921,683 B2 | 7/2005 | Nakayama | |
| 6,921,975 B2 | 7/2005 | Leal et al. | |
| 6,930,256 B1 | 8/2005 | Huemoeller et al. | |
| 6,939,738 B2 | 9/2005 | Nakatani et al. | |
| 6,948,944 B2 | 9/2005 | Ueno | |
| 6,953,708 B2 | 10/2005 | Hedler et al. | |
| 6,964,887 B2 | 11/2005 | Akagawa | |
| 6,964,889 B2 | 11/2005 | Ma et al. | |
| 6,975,516 B2 | 12/2005 | Asahi et al. | |
| 6,991,966 B2 | 1/2006 | Tuominen | |
| 7,015,075 B2 | 3/2006 | Fay et al. | |
| 7,045,908 B2 | 5/2006 | Ohsumi | |
| 7,048,450 B2 | 5/2006 | Beer et al. | |
| 7,053,475 B2 | 5/2006 | Akagawa | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,087,991 B2 | 8/2006 | Chen et al. | |
| 7,091,595 B2 | 8/2006 | Fuergut et al. | |
| 7,112,467 B2 | 9/2006 | Eichelberger et al. | |
| 7,122,901 B2 | 10/2006 | Sunohara et al. | |
| 7,141,884 B2 * | 11/2006 | Kojima et al. | 257/778 |
| 7,145,228 B2 | 12/2006 | Yean et al. | |
| 7,163,843 B2 | 1/2007 | Kiendl et al. | |
| 7,262,497 B2 | 8/2007 | Fang | |
| 7,294,529 B2 | 11/2007 | Tuominen | |
| 7,294,791 B2 | 11/2007 | Danoski et al. | |
| 7,294,920 B2 | 11/2007 | Chen et al. | |
| 7,294,922 B2 | 11/2007 | Jobetto et al. | |
| 7,299,546 B2 | 11/2007 | Tuominen et al. | |
| 7,312,103 B1 | 12/2007 | Huemoeller et al. | |
| 7,338,892 B2 | 3/2008 | Wang et al. | |
| 7,342,803 B2 | 3/2008 | Inagaki et al. | |
| 7,344,917 B2 | 3/2008 | Gautham | |
| 7,352,054 B2 | 4/2008 | Jobetto | |
| 7,361,533 B1 | 4/2008 | Huemoeller et al. | |
| 7,361,987 B2 | 4/2008 | Leal et al. | |
| 7,364,944 B2 | 4/2008 | Huang et al. | |
| 7,371,617 B2 | 5/2008 | Tsai et al. | |
| 7,411,306 B2 | 8/2008 | Leu et al. | |
| 7,425,464 B2 | 9/2008 | Fay et al. | |
| 7,453,148 B2 | 11/2008 | Yang et al. | |
| 7,476,563 B2 | 1/2009 | Mangrum et al. | |
| 7,482,198 B2 | 1/2009 | Bauer et al. | |
| 7,501,310 B2 | 3/2009 | Yang et al. | |
| 7,501,696 B2 | 3/2009 | Koyama et al. | |
| 7,511,356 B2 | 3/2009 | Subramanian | |
| 7,511,365 B2 | 3/2009 | Wu et al. | |
| 7,514,767 B2 | 4/2009 | Yang | |
| 7,523,551 B2 | 4/2009 | Horng et al. | |
| 7,525,185 B2 | 4/2009 | Yang et al. | |
| 7,528,009 B2 | 5/2009 | Chen et al. | |
| 7,547,967 B2 | 6/2009 | Jobetto et al. | |
| 7,550,320 B2 | 6/2009 | Wang | |
| 7,550,843 B2 | 6/2009 | Mihara | |
| 7,557,437 B2 | 7/2009 | Yang et al. | |
| 7,572,676 B2 | 8/2009 | Leu et al. | |
| 7,572,681 B1 | 8/2009 | Huemoeller et al. | |
| 7,575,173 B2 | 8/2009 | Fuergut et al. | |
| 7,588,951 B2 | 9/2009 | Mangrum et al. | |
| 7,591,067 B2 | 9/2009 | Wang | |
| 7,595,226 B2 | 9/2009 | Lytle et al. | |
| 7,598,607 B2 | 10/2009 | Chung et al. | |
| 7,609,527 B2 | 10/2009 | Tuominen et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,633,765 B1 | 12/2009 | Scanlan et al. | |
| 7,639,473 B2 | 12/2009 | Hsu et al. | |
| 7,655,501 B2 | 2/2010 | Yang et al. | |
| 7,662,667 B2 | 2/2010 | Shen | |
| 7,667,318 B2 | 2/2010 | Yang et al. | |
| 7,669,320 B2 | 3/2010 | Hurwitz et al. | |
| 7,675,157 B2 | 3/2010 | Liu et al. | |
| 7,692,286 B1 | 4/2010 | Huemoeller et al. | |
| 7,714,431 B1 | 5/2010 | Huemoeller et al. | |
| 7,727,803 B2 | 6/2010 | Yamagata | |
| 7,727,818 B2 | 6/2010 | Hsieh et al. | |
| 7,732,242 B2 | 6/2010 | Brunnbauer et al. | |
| 7,741,151 B2 | 6/2010 | Amrine et al. | |
| 7,759,163 B2 | 7/2010 | Kroeninger et al. | |
| 7,763,976 B2 | 7/2010 | Tang et al. | |
| 7,767,495 B2 | 8/2010 | Fuergut et al. | |
| 7,807,512 B2 | 10/2010 | Lee et al. | |
| 7,812,434 B2 | 10/2010 | Yang | |
| 7,830,004 B2 | 11/2010 | Wu | |
| 7,834,464 B2 | 11/2010 | Meyer et al. | |
| 7,932,599 B2 | 4/2011 | Kiendl et al. | |
| 8,017,515 B2 | 9/2011 | Marimuthu et al. | |
| 8,039,303 B2 | 10/2011 | Shim et al. | |
| 2002/0127780 A1 | 9/2002 | Ma et al. | |
| 2003/0090883 A1 * | 5/2003 | Asahi et al. | 361/761 |
| 2004/0012099 A1 | 1/2004 | Nakayama | |
| 2004/0178500 A1 | 9/2004 | Usui | |
| 2005/0062173 A1 | 3/2005 | Vu et al. | |
| 2005/0112798 A1 | 5/2005 | Bjorbell | |
| 2005/0253244 A1 | 11/2005 | Chang | |
| 2006/0065387 A1 | 3/2006 | Tonapi et al. | |
| 2006/0231944 A1 | 10/2006 | Huang et al. | |

| | | |
|---|---|---|
| 2007/0025092 A1 | 2/2007 | Lee et al. |
| 2007/0096311 A1 | 5/2007 | Humpston et al. |
| 2007/0131349 A1 | 6/2007 | Tuominen et al. |
| 2007/0176281 A1 | 8/2007 | Kim et al. |
| 2007/0222054 A1 | 9/2007 | Hembree |
| 2007/0227761 A1 | 10/2007 | Tuominen et al. |
| 2007/0246252 A1 | 10/2007 | Buchwalter et al. |
| 2007/0246806 A1 | 10/2007 | Ong et al. |
| 2007/0296065 A1 | 12/2007 | Yew et al. |
| 2008/0094805 A1 | 4/2008 | Tuominen et al. |
| 2008/0105967 A1 | 5/2008 | Yang et al. |
| 2008/0116564 A1 | 5/2008 | Yang et al. |
| 2008/0136002 A1 | 6/2008 | Yang |
| 2008/0136004 A1 | 6/2008 | Yang et al. |
| 2008/0137314 A1* | 6/2008 | Salama et al. .............. 361/761 |
| 2008/0157336 A1 | 7/2008 | Yang |
| 2008/0157396 A1 | 7/2008 | Yang |
| 2008/0174008 A1 | 7/2008 | Yang et al. |
| 2008/0197469 A1 | 8/2008 | Yang et al. |
| 2008/0237879 A1 | 10/2008 | Yang |
| 2008/0251908 A1 | 10/2008 | Yang et al. |
| 2008/0258293 A1 | 10/2008 | Yang et al. |
| 2008/0274593 A1 | 11/2008 | Yang et al. |
| 2009/0014872 A1 | 1/2009 | Tuominen et al. |
| 2009/0051025 A1 | 2/2009 | Yang et al. |
| 2009/0075428 A1 | 3/2009 | Tang et al. |
| 2009/0101400 A1* | 4/2009 | Yamakoshi .................. 174/260 |
| 2009/0102066 A1 | 4/2009 | Lee et al. |
| 2009/0127686 A1 | 5/2009 | Yang et al. |
| 2009/0129037 A1* | 5/2009 | Yoshino ....................... 361/761 |
| 2009/0133251 A1 | 5/2009 | Tuominen et al. |
| 2009/0140394 A1 | 6/2009 | Bathan et al. |
| 2009/0146297 A1 | 6/2009 | Badakere et al. |
| 2009/0166785 A1 | 7/2009 | Camacho et al. |
| 2009/0224391 A1 | 9/2009 | Lin et al. |
| 2009/0236686 A1 | 9/2009 | Shim et al. |
| 2009/0261466 A1 | 10/2009 | Pagaila et al. |
| 2010/0006330 A1 | 1/2010 | Fu et al. |
| 2010/0006994 A1 | 1/2010 | Shim et al. |
| 2010/0072599 A1 | 3/2010 | Camacho et al. |
| 2010/0072618 A1 | 3/2010 | Camacho et al. |
| 2010/0084759 A1 | 4/2010 | Shen |
| 2010/0214780 A1 | 8/2010 | Villard |
| 2010/0224983 A1 | 9/2010 | Huang et al. |
| 2010/0244208 A1 | 9/2010 | Pagaila et al. |
| 2010/0308449 A1 | 12/2010 | Yang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2010/0326707 A1 | 12/2010 | Kwon et al. |
| 2011/0018118 A1 | 1/2011 | Hsieh et al. |
| 2011/0018124 A1 | 1/2011 | Yang et al. |
| 2011/0037169 A1 | 2/2011 | Pagaila |
| 2011/0068453 A1 | 3/2011 | Cho et al. |
| 2011/0068459 A1 | 3/2011 | Pagaila et al. |
| 2011/0115060 A1 | 5/2011 | Chiu et al. |
| 2011/0127654 A1 | 6/2011 | Weng et al. |
| 2011/0140364 A1 | 6/2011 | Head |
| 2011/0169150 A1 | 7/2011 | Su et al. |
| 2011/0177654 A1 | 7/2011 | Lee et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0278741 A1 | 11/2011 | Chua et al. |
| 2012/0119373 A1 | 5/2012 | Hunt et al. |
| 2012/0153493 A1 | 6/2012 | Lee et al. |

FOREIGN PATENT DOCUMENTS

TW         236323       7/2005

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

* cited by examiner

EMBEDDED COMPONENT SUBSTRATE AND MANUFACTURING METHODS THEREOF

FIELD OF THE INVENTION

The invention relates generally to substrates including electrical circuitry and manufacturing methods thereof. More particularly, the invention relates to an embedded component substrate and manufacturing methods thereof.

BACKGROUND

Semiconductor devices have become progressively more complex, driven at least in part by the demand for smaller sizes and enhanced processing speeds. At the same time, there is a demand to further miniaturize many electronic products including these semiconductor devices. Semiconductor devices are typically packaged, and then may be installed on a substrate including electrical circuitry, such as a circuit board. This results in space being occupied by both the semiconductor device package and the substrate, and in surface area on the substrate being occupied by the semiconductor device package. In addition, additional cost may be incurred by performing packaging, circuit board manufacturing, and assembly as separate processes. It would be desirable to reduce the space occupied by the semiconductor device on the substrate, and to simplify and combine the packaging, circuit board manufacturing, and assembly processes as applied to the semiconductor device and the substrate.

It is against this background that a need arose to develop the embedded component substrate and related methods described herein.

SUMMARY

One aspect of the invention relates to an embedded component substrate. In one embodiment, the embedded component substrate includes a semiconductor device including: (a) a lower surface; (b) lateral surfaces disposed adjacent to a periphery of the semiconductor device; and (c) an upper surface opposite the lower surface. The embedded component substrate further includes a first patterned conductive layer including a first electrical interconnect extending substantially laterally within the first patterned conductive layer. The embedded component substrate further includes a second electrical interconnect extending substantially vertically from a first surface of the first electrical interconnect, the second electrical interconnect including: (a) a lower surface adjacent to the first surface; (b) a lateral surface; and (c) an upper surface opposite the lower surface of the second electrical interconnect. The embedded component substrate further includes a first dielectric layer including: (a) an upper surface; (b) a lower surface; and (c) a first opening extending from the upper surface of the first dielectric layer to the lower surface of the first dielectric layer, wherein the first dielectric layer substantially covers the lateral surfaces of the semiconductor device, the upper surface of the semiconductor device, and at least a portion of the lateral surface of the second electrical interconnect, and wherein the second electrical interconnect substantially fills the first opening. The embedded component substrate further includes a second patterned conductive layer adjacent to the upper surface of the first dielectric layer and the upper surface of the second electrical interconnect.

In another embodiment, a method of forming an embedded component substrate includes providing a semiconductor device including: (a) a lower surface; (b) lateral surfaces disposed adjacent to a periphery of the semiconductor device; and (c) an upper surface opposite the lower surface. The method further includes forming a first patterned conductive layer including a first electrical interconnect extending substantially laterally within the first patterned conductive layer. The method further includes forming a second electrical interconnect extending substantially vertically from a first surface of the first electrical interconnect, the second electrical interconnect including: (a) a lower surface adjacent to the first surface; (b) a lateral surface; and (c) an upper surface opposite the lower surface of the second electrical interconnect. The method further includes disposing the semiconductor device such that the upper surface and the lower surface of the semiconductor device are between a first plane defined by the upper surface of the second electrical interconnect and a second plane defined by the first surface, and such that the semiconductor device is electrically connected to the first patterned conductive layer. The method further includes forming a first dielectric layer including: (a) an upper surface; (b) a lower surface; and (c) a first opening extending from the upper surface of the first dielectric layer to the lower surface of the first dielectric layer. The first dielectric layer is formed such that the second electrical interconnect substantially fills the first opening, and such that the first dielectric layer substantially covers the lateral surfaces of the semiconductor device, the upper surface of the semiconductor device, and at least a portion of the lateral surface of the second electrical interconnect. The method further includes forming a second patterned conductive layer adjacent to the upper surface of the first dielectric layer and the upper surface of the second electrical interconnect.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

Figure 1:
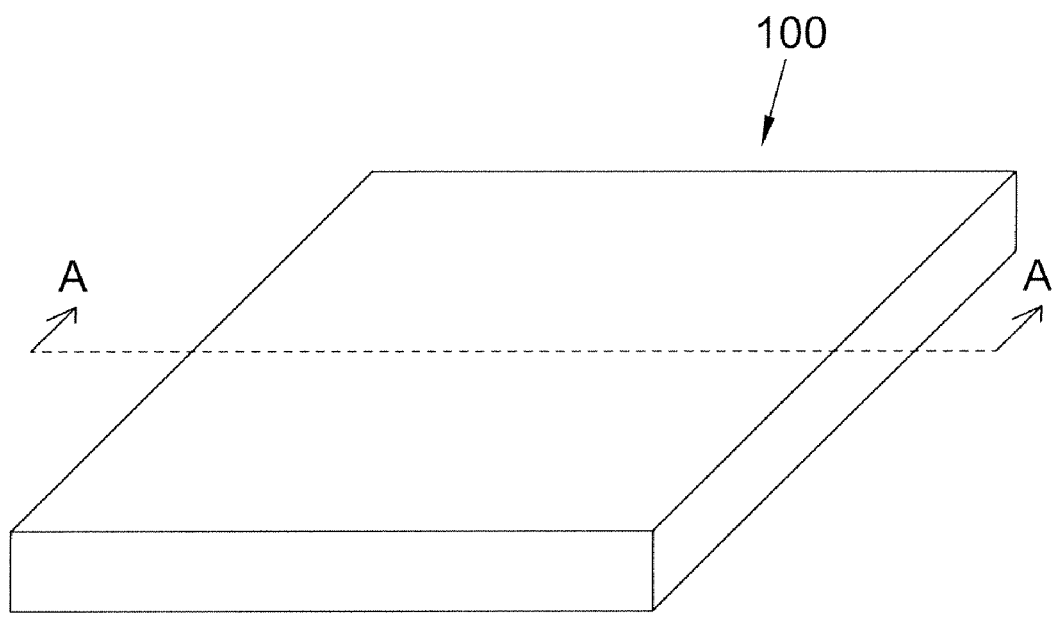
FIG. 1 illustrates a perspective view of an embedded component substrate, according to an embodiment of the invention.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an electrical interconnect can include multiple electrical interconnects unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

DESCRIPTION OF EMBODIMENTS OF THE INVENTION

Attention first turns to FIG. 1, which illustrates a perspective view of an embedded component substrate 100 implemented in accordance with an embodiment of the invention. In the illustrated embodiment, sides of the embedded component substrate 100 are substantially planar and have a substantially orthogonal orientation so as to define a lateral profile that extends around substantially an entire periphery of the embedded component substrate 100. This orthogonal lateral profile allows a reduced overall size by reducing or minimizing an area of the embedded component substrate 100. This reduction in area may be advantageous, for example, because the area may correspond to a footprint area of the embedded component substrate 100 when stacked on another substrate. However, it is contemplated that the lateral profile of the embedded component substrate 100, in general, can be any of a number of shapes, such as curved, inclined, stepped, or roughly textured. Some embodiments of the internal structure of the embedded component substrate 100 are illustrated in FIGS. 2 and 3.

Figure 2:
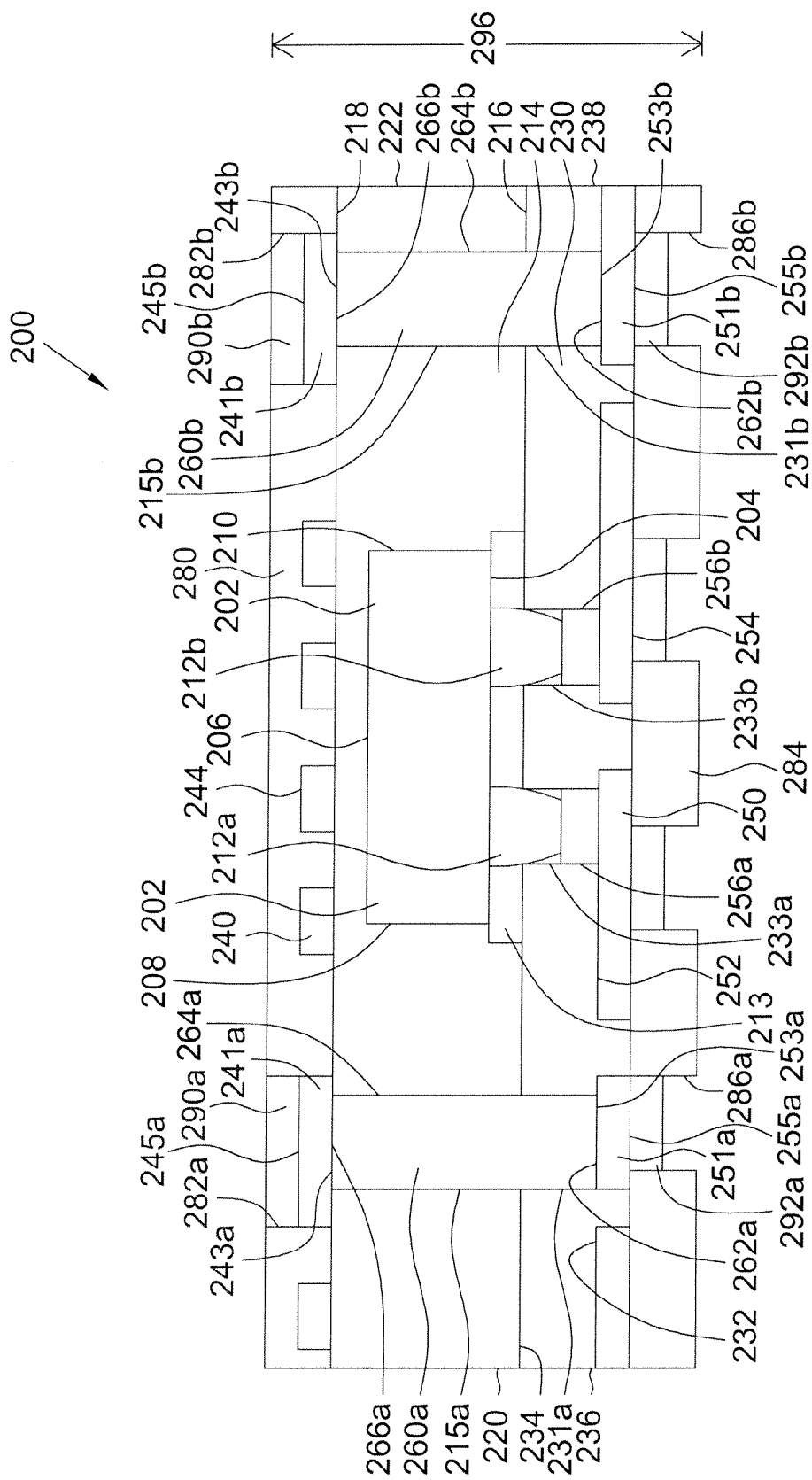
FIG. 2 illustrates a cross-sectional view of an embedded component substrate, according to an embodiment of the invention.
Figure 3:
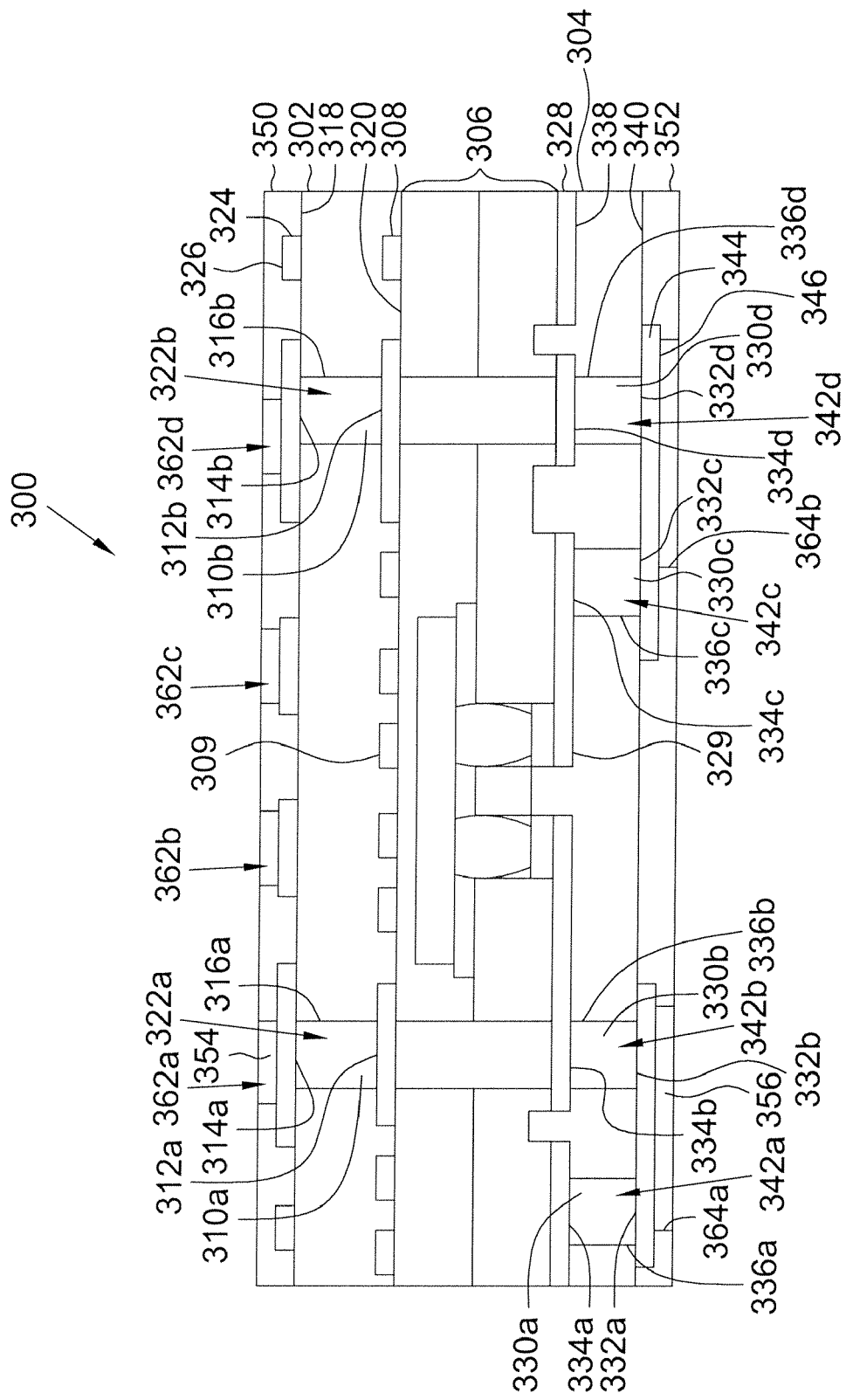
FIG. 3 illustrates a cross-sectional view of an embedded component substrate, according to another embodiment of the invention.

FIG. 2 illustrates a cross-sectional view of an embedded component substrate 200, in accordance with one embodiment of the present invention. The cross-sectional view is taken along line A-A of FIG. 1, where the embedded component substrate 200 is one embodiment of the embedded component substrate 100. Referring to FIG. 2, the embedded component substrate 200 includes a semiconductor device 202, which includes a lower surface 204, an upper surface 206, and lateral surfaces 208 and 210 disposed adjacent to a periphery of the semiconductor device 202 and extending between the lower surface 204 and the upper surface 206. In the illustrated embodiment, each of the surfaces 204, 206, 208, and 210 is substantially planar, with the lateral surfaces 208 and 210 having a substantially orthogonal orientation with respect to the lower surface 204 or the upper surface 206, although it is contemplated that the shapes and orientations of the surfaces 204, 206, 208, and 210 can vary for other implementations. As illustrated in FIG. 2, the upper surface 206 is a back surface of the semiconductor device 202, while the lower surface 204 is an active surface of the semiconductor device 202. In one embodiment, connectors 212a and 212b are disposed adjacent to the lower surface 204. These connectors 212 provide input and output electrical connections for the semiconductor device 202 to conductive structures included in the embedded component substrate 100, such as a patterned conductive layer 250 (described below). In one embodiment, the connectors 212 may be solder bumps. In one embodiment, an underfill layer 213 may optionally be added between the lower surface 204 and a dielectric layer 230 (described below). The underfill layer 213 may include epoxy, resin, or other suitable materials. In the illustrated embodiment, the semiconductor device 202 is a semiconductor chip, although it is contemplated that the semiconductor device 202, in general, can be any active device, any passive device, or a combination thereof. While one semiconductor device is illustrated in FIG. 2, it is contemplated that additional semiconductor devices can be included for other implementations.

As illustrated in FIG. 2, the embedded component substrate 200 also includes a dielectric layer 214 that is disposed adjacent to the semiconductor device 202. In the illustrated embodiment, the dielectric layer 214 substantially covers or encapsulates the semiconductor device 202 in conjunction with the underfill layer 213 and the dielectric layer 230 (described below) to provide mechanical stability as well as protection against oxidation, humidity, and other environmental conditions. In this embodiment, the dielectric layer 214 substantially covers the upper surface 206 and the lateral surfaces 208 and 210 of the semiconductor device 202, with the lower surface 204 the semiconductor device 202 being substantially exposed or uncovered by the dielectric layer 214.

As illustrated in FIG. 2, the dielectric layer 214 includes a lower surface 216, an upper surface 218, and lateral surfaces 220 and 222 disposed adjacent to a periphery of the dielectric layer 214 and extending between the lower surface 216 and the upper surface 218. In the illustrated embodiment, each of the surfaces 216, 218, 220, and 222 is substantially planar, with the lateral surfaces 220 and 222 having a substantially orthogonal orientation with respect to the lower surface 116 and the upper surface 218, although it is contemplated that the shapes and orientations of the surfaces 216, 218, 220, and 222 can vary for other implementations.

As illustrated in FIG. 2, the dielectric layer 230 includes a lower surface 232, an upper surface 234, and lateral surfaces 236 and 238 disposed adjacent to a periphery of the dielectric layer 230 and extending between the lower surface 232 and the upper surface 234. In the illustrated embodiment, each of the surfaces 234, 236, and 238 is substantially planar, with the lateral surfaces 236 and 238 having a substantially orthogonal orientation with respect to the upper surface 234, although it is contemplated that the shapes and orientations of the surfaces 234, 236, and 238 can vary for other implementations. The lower surface 232 is shown as extending into openings in the patterned conductive layer 250 (described below), although it is contemplated that the shape and orientation of the lower surface 232 can vary for other implementations. For example, the lower surface 232 may be substantially planar. The upper surface 234 may be adjacent to the lower surface 216 of the dielectric layer 214.

In this embodiment, the embedded component substrate 200 includes two dielectric layers (214 and 230), and can be referred to as a two-layer embedded component substrate. In another embodiment, the embedded component substrate 200 may include a single dielectric layer, such as dielectric layer 214, without including the dielectric layer 230. In this embodiment, the embedded component substrate 200 can be referred to as a one-layer embedded component substrate. For example, the semiconductor device 202 may be wire-bonded, in which case the semiconductor device 202 may be disposed adjacent to the patterned conductive layer 250. Alternatively, the semiconductor device 202 may be disposed adjacent to a die pad (not shown).

In general, each of the dielectric layers 214 and 230 can be formed from a dielectric material that is polymeric or non-polymeric. For example, at least one of the dielectric layers 214 and 230 can be formed from polyimide, polybenzoxazole, benzocyclobutene, or a combination thereof. The dielectric layers 214 and 230 can be formed from the same dielectric material or different dielectric materials. For certain implementations, at least one of the dielectric layers 214 and 230 can be formed from a dielectric material that is photoimageable or photoactive. While two dielectric layers 214 and 230 are illustrated in FIG. 2 as part of the embedded component substrate 200, it is contemplated that more or less dielectric layers can be included in an embedded component substrate in other embodiments (such as illustrated in FIG. 3).

As illustrated in FIG. 2, the embedded component substrate 200 further includes a patterned conductive layer 240 adjacent to the upper surface 218 of the dielectric layer 214, and the patterned conductive layer 250 adjacent to the lower surface 232 of the dielectric layer 230. The patterned conductive layer 240 has an upper surface 244, and the patterned conductive layer 250 has a lower surface 254. The patterned conductive layer 240 may include electrical interconnects 241a and 241b, and the patterned conductive layer 250 may include electrical interconnects 251a and 251b. The electrical interconnects 241a and 241b may extend substantially laterally within the patterned conductive layer 240, and the electrical interconnects 251a and 251b may extend substantially laterally within the patterned conductive layer 250. The electrical interconnects 251a and 251b have first surfaces 253a and 253b, respectively. The embedded component substrate 200 further includes electrical interconnects 260a and 260b.

The electrical interconnect 241a may electrically connect the electrical interconnect 260a to an electrical contact (not shown) or another electrical interconnect (not shown). In one embodiment, the electrical interconnect 241a may be adjacent to the electrical contact or the another electrical interconnect at an opening 282a in a protection layer 280 adjacent to the patterned conductive layer 240. The electrical interconnect 241b may electrically connect the electrical interconnect 260b to an electrical contact (not shown) or another electrical interconnect (not shown). In one embodiment, the electrical interconnect 241b may be adjacent to the electrical contact or the another electrical interconnect at an opening 282b in the protection layer 280.

The electrical interconnect 251a may electrically connect the electrical interconnect 260a to an electrical contact (not shown) or another electrical interconnect (not shown). In one embodiment, the electrical interconnect 251a may be adjacent to the electrical contact or the another electrical interconnect at an opening 286a in a protection layer 284 adjacent to the patterned conductive layer 250. The electrical interconnect 251b may electrically connect the electrical interconnect 260b to an electrical contact (not shown) or another electrical interconnect (not shown). In one embodiment, the electrical interconnect 251b may be adjacent to the electrical contact or the another electrical interconnect at an opening 286b in the protection layer 284.

The electrical interconnects 260a and 260b have lower surfaces 262a and 262b, lateral surfaces 264a and 264b, and upper surfaces 266a and 266b, respectively. The electrical interconnects 260a and 260b are positioned around the semiconductor device 202, and may extend substantially vertically from the first surfaces 253a and 253b, respectively. The lower surfaces 262a and 262b may be adjacent to the first surfaces 253a and 253b, respectively. At least a portion of the first surfaces 253a and 253b may be substantially covered by the dielectric layer 230.

As illustrated in FIG. 2, the dielectric layer 214 is formed so as to define openings 215a and 215b. The dielectric layer 230 is formed so as to define openings 231a and 231b, where the openings 231a and 231b may be substantially aligned with the openings 215a and 215b, respectively. The openings 215a and 215b may extend from the upper surface 218 to the lower surface 216 of the dielectric layer 214, and the openings 231a and 231b may extend from the upper surface 234 to the lower surface 232 of the dielectric layer 230. The electrical interconnect 260a may substantially fill the openings 215a and 231a, and the electrical interconnect 260b may substantially fill the openings 215b and 231b. Advantageously, by substantially filling the openings 215 and 231, the electrical interconnects 260 may enable enhanced electrical connectively characteristics. Although FIG. 2 shows that each of the dielectric layers 214 and 230 is adjacent to at least a portion of the two electrical interconnects 260a and 260b, it is contemplated that the dielectric layer 214 and the dielectric layer 230 may be adjacent to at least a portion of the same or different numbers of electrical interconnects 260.

At least a portion of the lateral surfaces 264a and 264b may be substantially covered by the dielectric layer 214. At least a portion of the lateral surfaces 264a and 264b may be substantially covered by the dielectric layer 230. In one embodiment, the upper surfaces 266a and 266b may be substantially co-planar with the upper surface 218 of the dielectric layer 214. The upper surface 266a may be adjacent to a lower surface 243a of the electrical interconnect 241a, and the upper surface 266b may be adjacent to a lower surface 243b of the electrical interconnect 241b.

In general, each of the patterned conductive layers 240 and 250 and each of the electrical interconnects 260a and 260b can be formed from a metal, a metal alloy, a matrix with a metal or a metal alloy dispersed therein, or another suitable electrically conductive material. For example, at least one of the patterned conductive layers 240 and 250 and at least one of the electrical interconnects 260a and 260b can be formed from aluminum, copper, titanium, or a combination thereof. The patterned conductive layers 240 and 250 and the electrical interconnects 260a and 260b can be formed from the same electrically conductive material or different electrically conductive materials. In one embodiment, a thickness of the patterned conductive layers 240 and 250 may be in the range 10 microns to 30 microns, such as a range of 10 microns to 20 microns, or a range of 20 microns to 30 microns.

The dielectric layer 230 may also be formed so as to define openings 233a and 233b, which are aligned and sized so as to accommodate the connectors 212a and 212b, respectively. The connectors 212a and 212b may be adjacent to an upper surface 252 of the patterned conductive layer 250. Alternatively, the connectors 212a and 212b may be adjacent to plating layers 256a and 256b, respectively. The plating layers 256a and 256b may be disposed on the upper surface 252.

The plating layers 256a and 256b can be formed similarly to the patterned conductive layer 250, as described previously. Alternatively, the plating layers 256a and 256b may be formed differently. For example, the plating layers 256a and 256b may be formed from at least one of tin, nickel, and gold, or an alloy including tin or including nickel and gold. The plating layers 256a and 256b can be formed from the same electrically conductive material or different electrically conductive materials.

The protection layers 280 and 284 can be formed similarly to the dielectric layers 214 and 230, as described previously. The protection layers 280 and 284 may be formed using solder mask (solder resist), such as dry film imageable solder mask, or another type of patternable layer or dielectric layer. While one protection layer 280 and one protection layer 284 is illustrated in FIG. 2, it is contemplated that more or less protection layers can be included for other implementations. The openings 282a and 282b in the protection layer 280 may expose portions of the electrically conductive layer 240, such as portions of the electrical interconnects 241a and 241b. The openings 282a and 282b may be substantially aligned with the upper surfaces 266a and 266b of the electrical interconnects 260a and 260b, respectively. The openings 286a and 286b in the protection layer 284 may expose portions of the electrically conductive layer 250, such as portions of the electrical interconnects 251a and 251b. The openings 286a and 286b may be substantially aligned with the lower surfaces 262a and 262b of the electrical interconnects 260a and 260b, respectively. The protection layers 280 and 284 may be patterned to form the openings 282 and 286, respectively, similarly to the patterning of the dielectric layers 134 and 136 described previously. The openings 282 and 286 can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Finish layers 290a and 290b can be formed adjacent to upper surfaces 245a and 245b of the electrical interconnects 241a and 241b, respectively. Finish layers 292a and 292b can be formed adjacent to lower surfaces 255a and 255b of the electrical interconnects 251a and 251b, respectively. The finish layers 290 and 292 can be formed similarly to the patterned conductive layer 250, as described previously. Alternatively, the finish layers 290 and 292 may be formed differently. For example, the finish layers 290 and 292 may be formed from at least one of tin, nickel, and gold, or an alloy including tin or including nickel and gold. The finish layers 290 and 292 can be formed from the same electrically conductive material or different electrically conductive materials.

Figure 4A:
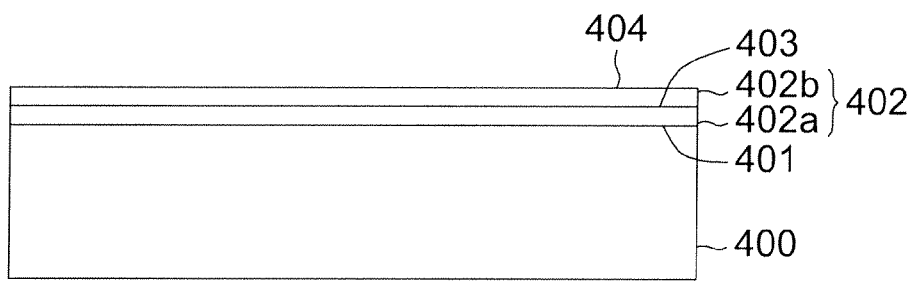
FIG. 4A through FIG. 4T illustrate a method of forming the embedded component substrate of FIG. 2, according to an embodiment of the invention.
Figure 4B:
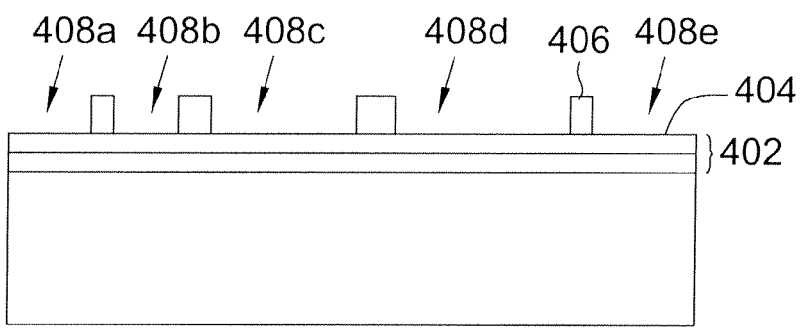
Figure 4C:
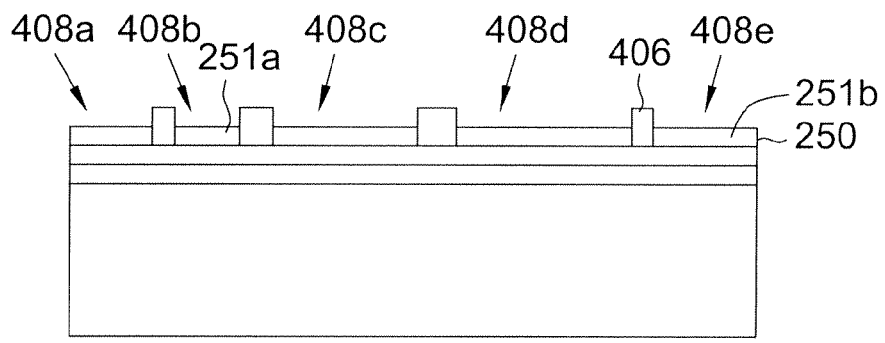
Figure 4D:
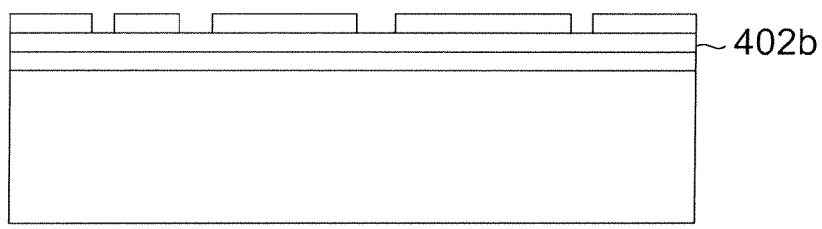
Figure 4E:
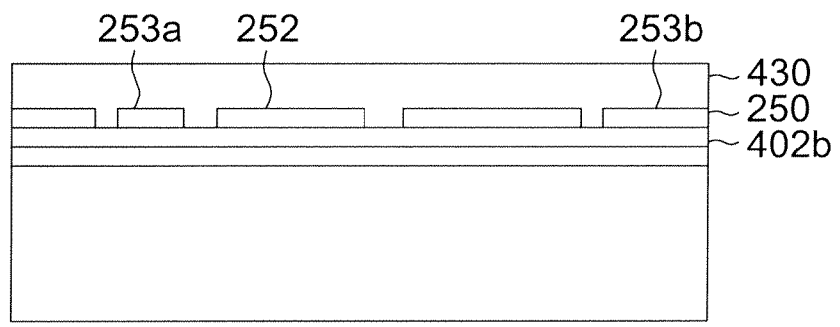
Figure 4F:
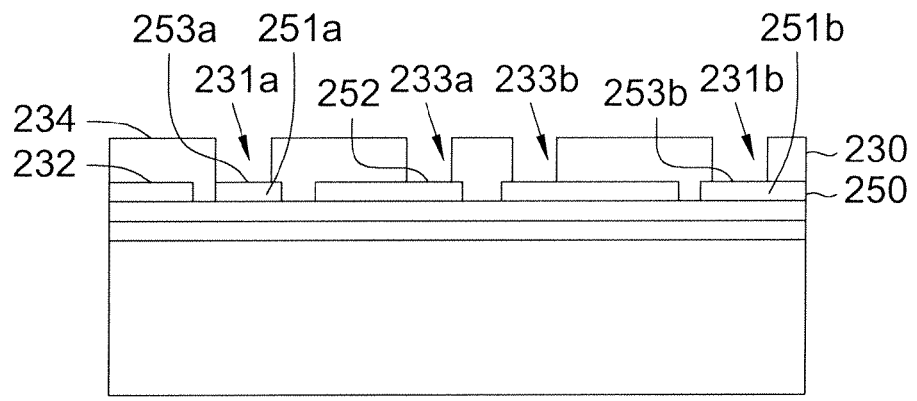
Figure 4G:
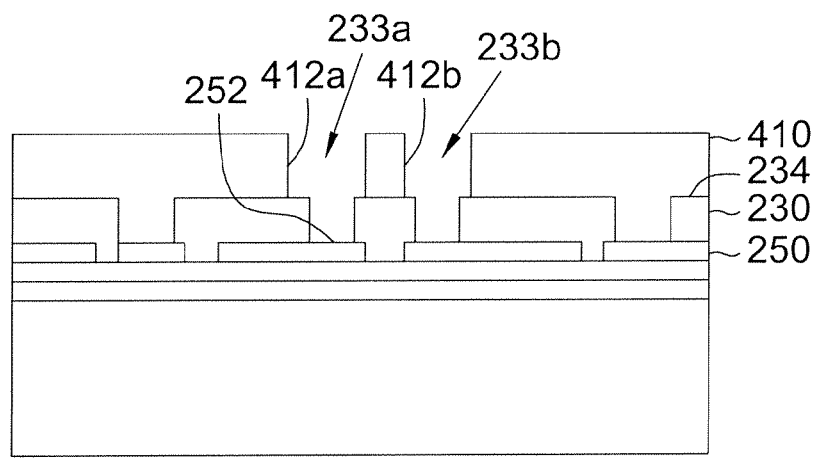
Figure 4H:
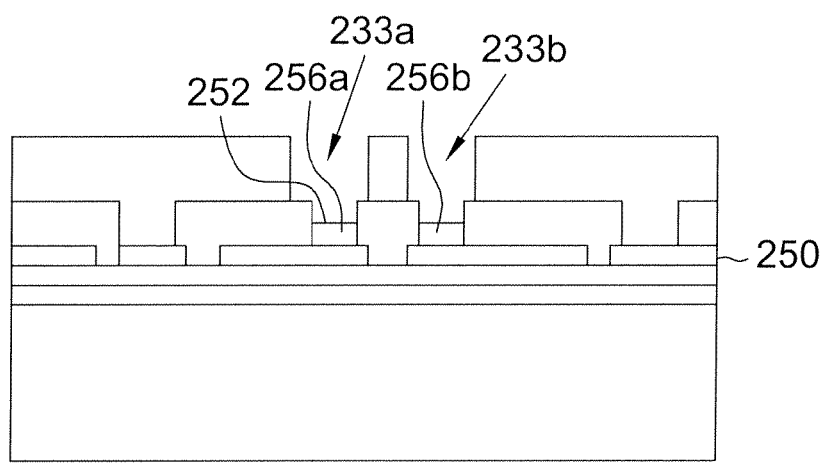
Figure 4I:
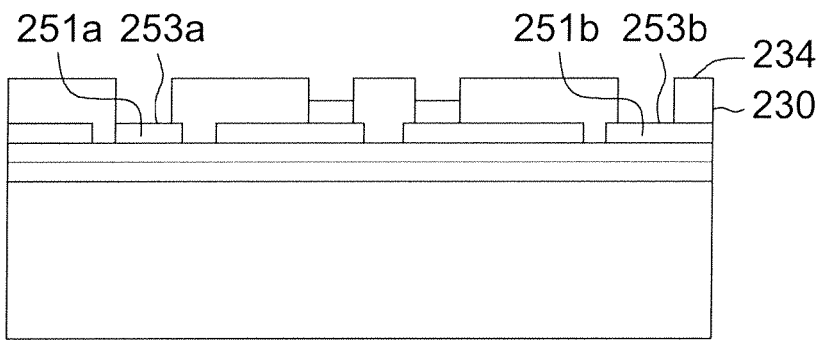
Figure 4J:
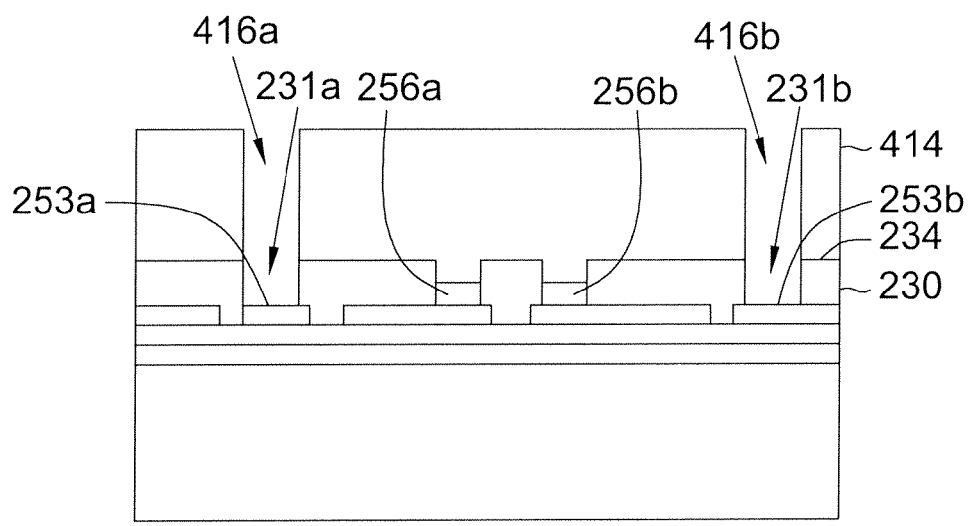
Figure 4K:
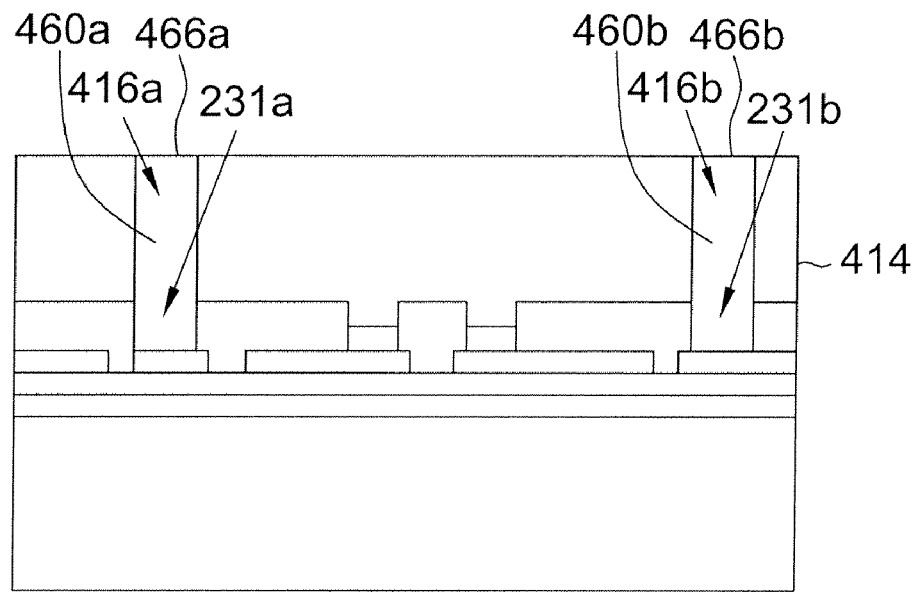
Figure 4L:
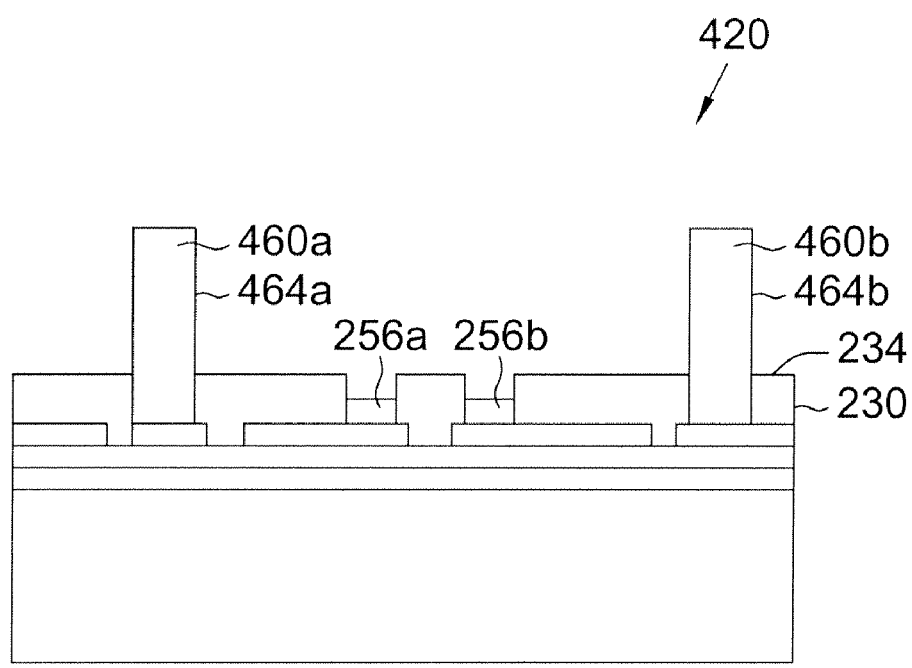
Figure 4M:
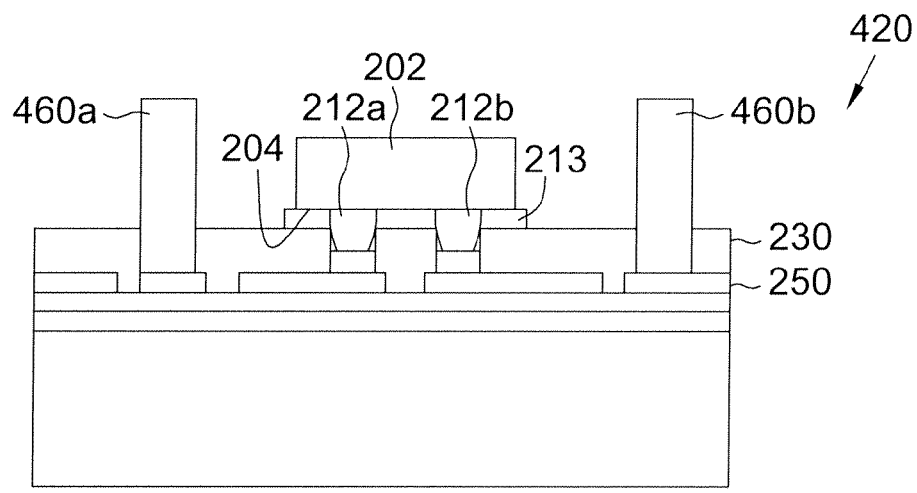
Figure 4N:
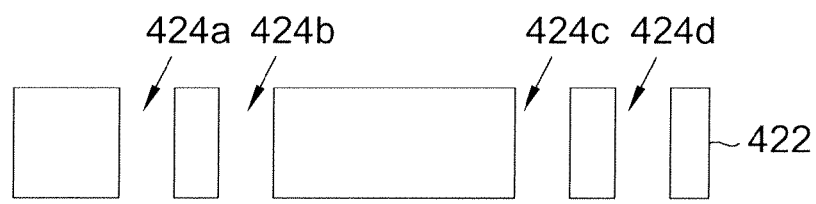
Figure 4O:
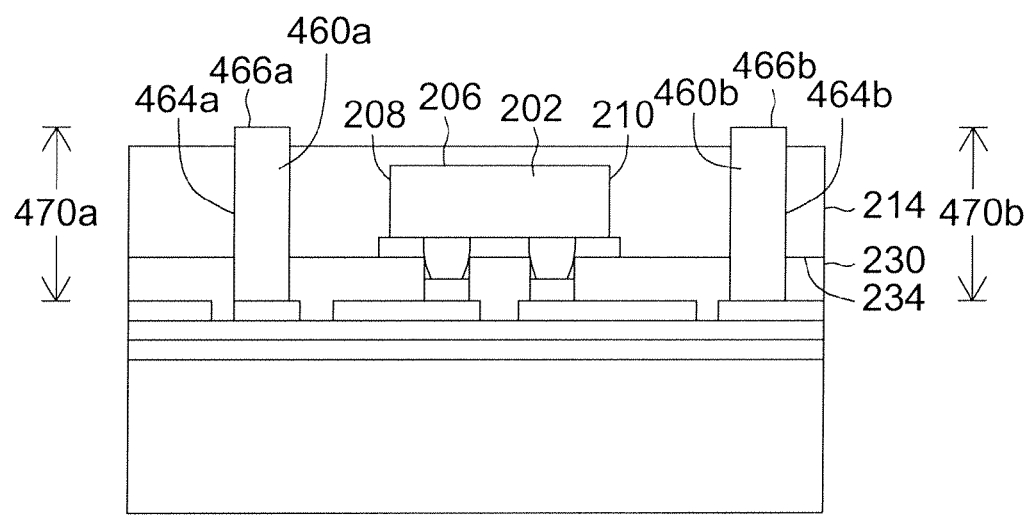

Advantageously, the dielectric layer 214 is not a preformed core and is fowled such that the dielectric layer 214 substantially covers the top surface 206 and the lateral surfaces 208 and 210 of the semiconductor device 202, such as through lamination of the pretreated dielectric layer 422 (described along with FIG. 4O). This can remove the need for a separate material, such as a filler material, to facilitate the attachment of the semiconductor device 202 to the preformed core. In one embodiment, the dielectric layer 214 includes a dielectric material, such that this same dielectric material in the dielectric layer 214 substantially covers the upper surface 206 and the lateral surfaces 208 and 210 of the semiconductor device 202, and at least a portion of the lateral surfaces 264a and 264b.

Figure 4P:
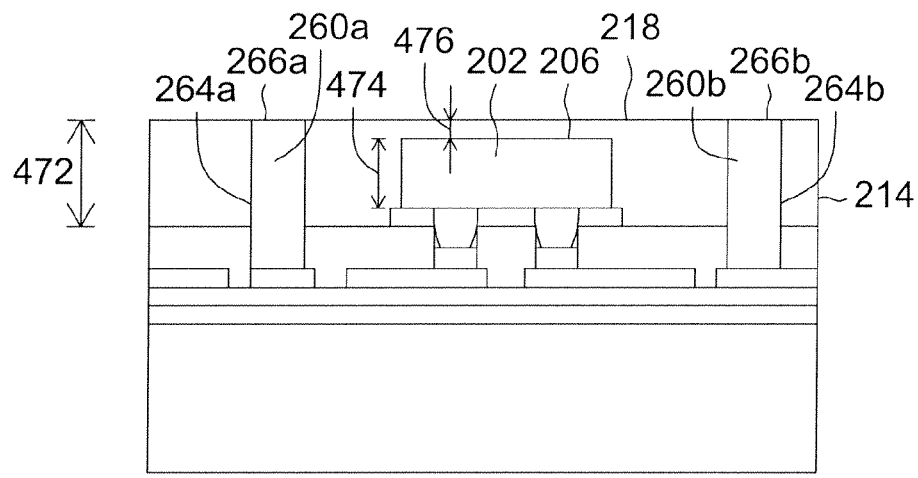

As described along with FIG. 4P, the thickness 472 of the dielectric layer 214 is adaptable so that a height 296 of the embedded component substrate 200 can be set based on the height 474, so that the height 296 can be reduced for semiconductor devices 202 with smaller height 474. Advantageously, this reduction in the height 296 can result in a corresponding reduction in the lengths of electrical interconnects in the embedded component substrate 200, which can result in improved electrical characteristics.

Advantageously, the patterned conductive layer 250 may serve as a redistribution network for the semiconductor device 202. In one embodiment, the embedded component substrate 200 may provide a fan-out configuration in which the patterned conductive layer 250 extends substantially laterally outside of the periphery of the semiconductor device 202. For example, FIG. 2 shows electrical interconnects 251a and 251b outside of the periphery of the semiconductor device 202. The electrical interconnects 251a and 251b may be electrically connected to the semiconductor device 202 via other electrical interconnects in the patterned conductive layer 250 (not shown). The fan-out configuration of the embedded component substrate 200 allows greater flexibility in terms of the arrangement and spacing of the contact pads of the semiconductor device 202 (not shown), with reduced dependence upon the arrangement and spacing of the contact pads the semiconductor device 202. The electrical interconnects 260a and 260b and the patterned conductive layer 240 extend this to a three-dimensional fan-out by providing electrical pathways from the semiconductor device 202 to the upper surface of the embedded component substrate 200. In such manner, the three-dimensional fan-out configuration of the embedded component substrate 200 advantageously increases flexibility beyond that provided by two-dimensional fan-out in terms of the arrangement and spacing of electrical contacts on an opposite side of the embedded component substrate 200 from the contact pads of the semiconductor device 202, which further reduces dependence upon the arrangement and spacing of the contact pads of the semiconductor device 102. As shown in FIG. 3, this three-dimensional fan-out configuration is also provided by the embedded component substrate 300.

Advantageously, by embedding the semiconductor device 202 within the embedded component substrate 200, the semiconductor device 202 does not physically occupy space on the surface of the embedded component substrate 200. Also, as shown in FIG. 4, the formation of the embedded component substrate 200 may simplify and combine aspects of the packaging, circuit board manufacturing, and assembly processes.

In another embodiment, an embedded component substrate may include additional structures similar to those shown in FIG. 2. For example, an embedded component substrate may include additional semiconductor devices, additional electrical interconnects, and additional patterned conductive layers not shown in FIG. 2.

Attention next turns to FIG. 3, which illustrates a cross-sectional view of an embedded component substrate 300, according to another embodiment of the invention. The embedded component substrate 300 can be referred to as a four-layer embedded component substrate in that two additional dielectric layers 302 and 304 have been added to a two-layer embedded component substrate similar to the embedded component substrate 200 (shown in FIG. 2). The two-layer structure 306 is similar to the structure between the upper surface 218 of the dielectric layer 214 and the lower surface 232 of the dielectric layer 230 (shown in FIG. 2), and will not be described again here. While a four-layer embedded component substrate 300 is illustrated in FIG. 3, it is contemplated that additional dielectric layers may be stacked above and/or below the dielectric layers 302 and 304 to form an embedded component substrate with more than four layers. It is also contemplated that a three-layer embedded component substrate can be formed by adding one of the dielectric layers 302 or 304 to the two-layer structure 306. It is also contemplated that in other embodiments, dielectric layers above and/or below the two-layer structure 306 may be adjacent to semiconductor devices.

As illustrated in FIG. 3, the embedded component substrate 300 includes a patterned conductive layer 308 adjacent to an upper surface 307 of the two-layer structure 306 (corresponding to the upper surfaces 218, 266a, and 266b shown in FIG. 2), and a patterned conductive layer 328 adjacent to a lower surface 305 of the structure 306 (corresponding to the lower surfaces 232, 262a, and 262b shown in FIG. 2). The patterned conductive layer 308 includes an upper surface 309, and the patterned conductive layer 328 includes a lower surface 329. In terms of material composition, the patterned conductive layers 308 and 328 are similar to the patterned conductive layers 240 and 250 (described along with FIGS. 2 and 4).

As illustrated in FIG. 3, the embedded component substrate 300 includes electrical interconnects 310a, 310b, and 330a-300d. The electrical interconnects 310a and 310b may extend substantially vertically from the upper surface 309 of the patterned conductive layer 308. Lower surfaces 312a and 312b of the electrical interconnects 310a and 310b, respectively, may be adjacent to the upper surface 309. The electrical interconnects 310a and 310b further include upper surfaces 314a and 314b, and lateral surfaces 316a and 316b, respectively. The electrical interconnects 330a-330d may extend substantially vertically from the lower surface 329 of the patterned conductive layer 328. Upper surfaces 334a-334d of the electrical interconnects 330a-330d, respectively, may be adjacent to the lower surface 329. The electrical interconnects 330a-330d further include lower surfaces 332a-332d, and lateral surfaces 336a-336d, respectively. It is contemplated that the dielectric layer 302 and the dielectric layer 304 may be adjacent to at least a portion of the same or different numbers of electrical interconnects 310 and/or 330. In terms of material composition, the electrical interconnects 310 and 330 are similar to the previously described electrical interconnects 260. In terms of material composition, the dielectric layers 302 and 304 are similar to the dielectric layers 214 and 230 (described along with FIGS. 2 and 4).

As illustrated in FIG. 3, the dielectric layer 302 includes openings, including openings 322a and 322b. Each opening 322 extends from an upper surface 318 of the dielectric layer 302 to a lower surface 320 of the dielectric layer 302. The electrical interconnects 310a and 310b substantially fill the openings 322a and 322b, respectively. Similarly, the dielectric layer 304 includes openings, including openings 342a-342d. Each opening 342 extends from an upper surface 338 of the dielectric layer 304 to a lower surface 340 of the dielectric layer 302. The electrical interconnects 330a-330d substantially fill the openings 342a-342d, respectively. The openings 322 and 342 are similar to the openings 215 and 231 (described along with FIGS. 2 and 4). In particular, the openings 322 and 342 can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

As illustrated in FIG. 3, a patterned conductive layer 324 is adjacent to the upper surface 318 of the dielectric layer 302, and is adjacent to the upper surfaces 314a and 314b of the electrical interconnects 310a and 310b, respectively. Also, a patterned conductive layer 344 is adjacent to the lower surface 340 of the dielectric layer 304, and is adjacent to the lower surfaces 332a and 332b of the electrical interconnects 330a and 330b, respectively. In terms of material composition, the patterned conductive layers 324 and 344 are similar to the patterned conductive layers 240 and 250 (described along with FIGS. 2 and 4).

As illustrated in FIG. 3, a protection layer 350 is adjacent to the upper surface 318 of the dielectric layer 302, and is adjacent to an upper surface 326 of the patterned conductive layer 324. Also, a protection layer 352 is adjacent to the lower surface 340 of the dielectric layer 304, and is adjacent to a lower surface 346 of the patterned conductive layer 344. In terms of material composition, the protection layers 350 and 352 are similar to the protection layers 280 and 284 (described along with FIGS. 2 and 4). The protection layer 350 may have openings 362a-362d that expose the upper surface 326, and the protection layer 352 may have openings 364a-364b that expose the lower surface 346. The openings 362 and 364 can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

As illustrated in FIG. 3, a metal finish 354 is applied to the exposed portions of the upper surface 326, and a metal finish 356 is applied to the exposed portions of the lower surface 346. In terms of material composition, the metal finish layers 354 and 356 are similar to the metal finish layers 290 and 292 (described along with FIGS. 2 and 4).

Figure 4Q:
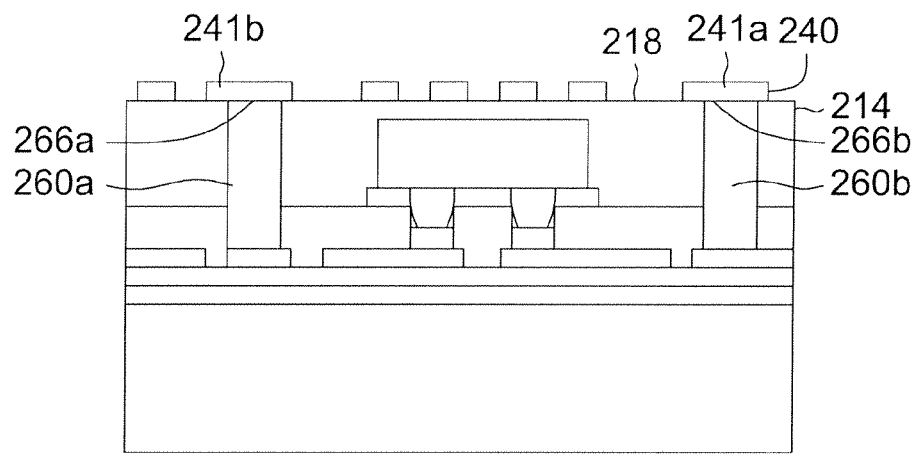
Figure 4R:
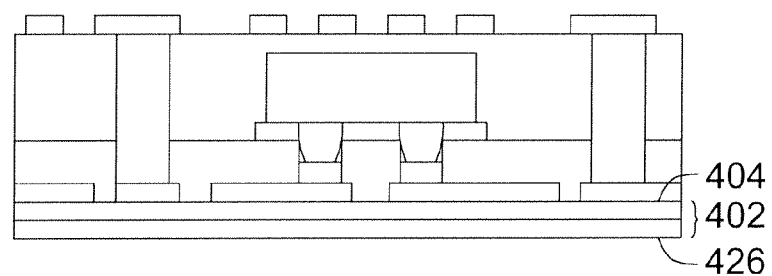
Figure 4S:
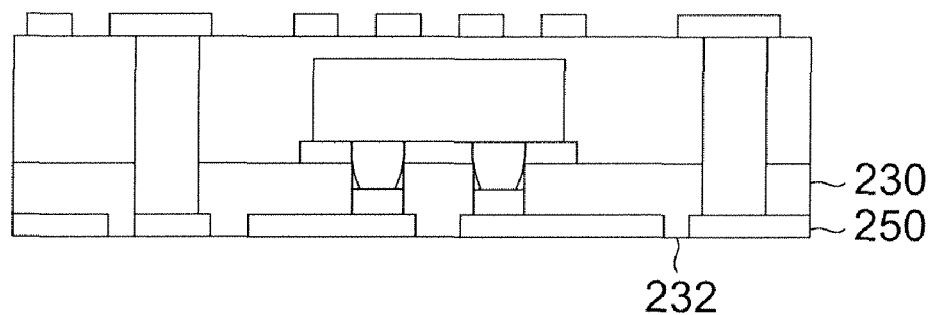
Figure 4T:
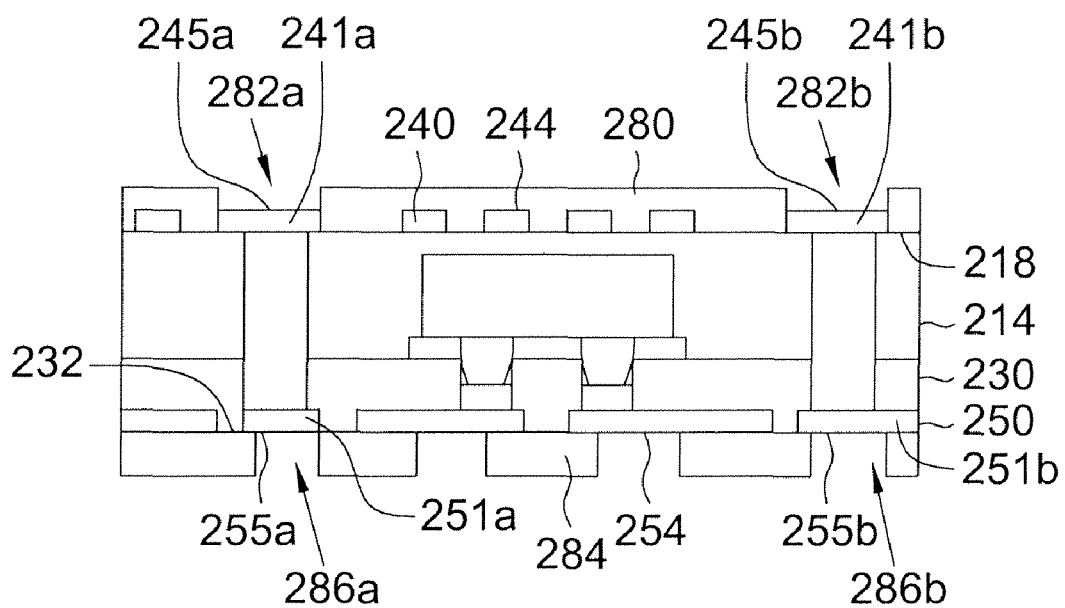

FIG. 4A through FIG. 4T illustrate a method of forming the embedded component substrate of FIG. 2, according to an embodiment of the invention. For ease of presentation, the following manufacturing operations are described with reference to the embedded component substrate 200 of FIG. 2. However, it is contemplated that the manufacturing operations can be similarly carried out to form other embedded component substrates that may have different internal structure from the embedded component substrate 200. In addition, it is contemplated that the manufacturing operations can be similarly carried out to form an embedded component substrate that includes multiple copies of the embedded component substrate 200 connected together, so that singulation of the embedded component substrate may result in the generation of multiple embedded component substrates 200.

Referring first to FIG. 4A, a carrier 400 is provided, and an electrically conductive layer 402 is disposed adjacent to an upper surface 401 of the carrier 400. The electrically conductive layer 402 has an upper surface 404, and may include multiple sub-layers 402a and 402b. The sub-layer 402a may be formed from a metal, a metal alloy, a matrix with a metal or a metal alloy dispersed therein, or another suitable electrically conductive material. For example, the sub-layer 402a may include a metallic foil formed from copper or an alloy including copper. The sub-layer 402a may be attached to the carrier 400 with a tape (not shown) disposed adjacent to the upper surface 401 of the carrier 400. The tape, which can be implemented as a single-sided or double-sided adhesive tape, secures components at an appropriate spacing with respect to one another, and allows subsequent manufacturing operations to be carried out with those components disposed adjacent to the carrier 400.

As illustrated in FIG. 4A, the sub-layer 402b may be applied to an upper surface 403 of the sub-layer 402a. The sub-layer 402b may be applied using any of a number of coating techniques, such as chemical vapor deposition, electroless plating, electrolytic plating, printing, spinning, spraying, sputtering, or vacuum deposition. The sub-layer 402b may be formed from a metal, a metal alloy, a matrix with a metal or a metal alloy dispersed therein, or another suitable electrically conductive material. The sub-layer 402b may be formed of an electrically conductive material different from that used to form the sub-layer 402a. For example, the sub-layer 402b may serve as an etch stop layer, and may include nickel or an alloy including nickel.

Next, as illustrated in FIG. 4B, a photoresist material may be applied to the upper surface 404 of the electrically conductive layer 402 to form a photoresist layer 406 adjacent to the upper surface 404. The photoresist material may be a dry film photoresist, or another type of patternable layer or dielectric layer. The photoresist layer 406 may be formed by coating, printing, or any other suitable technique. Predetermined or selected portions of the photoresist layer 406 may be photoimaged and developed so as to create openings, including openings 408a-408e, exposing the upper surface 404 of the electrically conductive layer 402. The photoresist layer 406 may be photochemically defined using a photomask (not shown). Photoimaging and developing may have advantages of lower cost and decreased process time as compared to other approaches for creating openings in the photoresist layer 406. The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 4C, an electrically conductive material is applied into the openings, including openings 408a-408e, defined by the photoresist layer 406 to form the patterned conductive layer 250, including the electrical interconnects 251a and 251b. The patterned conductive layer 250 may be formed using any of a number of coating techniques, such as chemical vapor deposition, electroless plating, electrolytic plating, printing, spinning, spraying, sputtering, or vacuum deposition.

Next, as illustrated in FIG. 4D, the photoresist layer 406 is stripped to expose portions of the sub-layer 402b.

Next, as illustrated in FIG. 4E, a dielectric layer 430 is formed adjacent to the patterned conductive layer 250 and the exposed portions of the sub-layer 402b. The dielectric layer 430 may substantially cover the upper surface 252 of the patterned conductive layer 250, such that the patterned conductive layer 250 is embedded in the dielectric layer 430. A dielectric material may be applied using any of a number of coating techniques, such as printing, spinning, or spraying. In one embodiment, the dielectric layer 430 may be created by laminating a dielectric material on the upper surface 252 of the patterned conductive layer 250 (including the first surfaces 253a and 253b) and the exposed portions of the sub-layer 402b. Alternatively, the dielectric layer 430 may be created by spreading the dielectric material in liquid form on the upper surface 252 of the patterned conductive layer 250 (including the first surfaces 253a and 253b) and the exposed portions of the sub-layer 402b. The dielectric layer 430 may be formed using the same types of materials as previously described for the dielectric layer 230.

Next, as illustrated in FIG. 4F, the openings 231a and 231b are formed in the dielectric layer 430 to expose the first surfaces 253a and 253b of the electrical interconnects 251a and 251b, respectively. In addition, the openings 233a and 233b are formed in the dielectric layer 430 to expose additional portions of the upper surface 252 of the patterned conductive layer 250. In this way, the dielectric layer 430 is patterned to form the dielectric layer 230 including the openings 231a, 231b, 233a, and 233b. The openings 231a, 231b, 233a, and 233b may extend from the upper surface 234 of the dielectric layer 230 to the lower surface 232 of the dielectric layer 230. Patterning of the dielectric material to form the dielectric layer 230 can be carried out in any of a number of ways, such as photolithography, chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 4G, a photoresist material may be applied to the upper surface 234 of the dielectric layer 230 to form a photoresist layer 410 adjacent to the upper surface 234. The photoresist material may be a dry film photoresist, or another type of patternable layer or dielectric layer. The photoresist layer 410 may be formed as described previously for FIG. 4B. Also as described previously for FIG. 4B, predetermined or selected portions of the photoresist layer 410 may be photoimaged and developed so as to create openings, including openings 412a and 412b. The openings 412a and 412b may be aligned with the openings 233a and 233b, respectively, to expose portions of the upper surface 252 of the patterned conductive layer 250. The openings 412a and 412b may have characteristics similar to those of the openings 408a-408e.

Next, as illustrated in FIG. 4H, an electrically conductive material is applied into the openings 233a and 233b that expose portions of the upper surface 252 of the patterned conductive layer 250. In this way, the plating layers 256a and 256b may be formed using any of the techniques described previously for FIG. 4C.

Next, as illustrated in FIG. 4I, the photoresist layer 410 is stripped to expose the upper surface 234 of the dielectric layer 230, and the first surfaces 253a and 253b of the electrical interconnects 251a and 251b, respectively.

Next, as illustrated in FIG. 4J, a photoresist material may be applied to the upper surface 234 of the dielectric layer 230 and to the plating layers 256a and 256b to form a photoresist layer 414 adjacent to the upper surface 234 and to the plating layers 256a and 256b. The photoresist material may be a dry film photoresist, or another type of patternable layer or dielectric layer. The photoresist layer 414 may be formed as described previously for FIG. 4B. Also as described previously for FIG. 4B, predetermined or selected portions of the photoresist layer 414 may be photoimaged and developed so as to create openings, including openings 416*a* and 416*b*. The openings 416*a* and 416*b* may be aligned with the openings 231*a* and 231*b*, respectively, to expose the first surfaces 253*a* and 253*b*. The openings 416*a* and 416*b* may have characteristics similar to those of the openings 408*a*-408*e*.

Next, as illustrated in FIG. 4K, an electrically conductive material is applied into the openings 416*a* and 416*b* defined by the photoresist layer 414, and into the openings 231*a* and 231*b*, to form electrical interconnects 460*a* and 460*b*, respectively. The electrical interconnects 460*a* and 460*b* may be formed extending substantially vertically away from the electrically conductive layer 402. The electrical interconnect 460*a* may substantially fill the openings 416*a* and 231*a*, and the electrical interconnect 460*b* may substantially fill the openings 416*b* and 231*b*. The electrical interconnects 460*a* and 460*b* include upper surfaces 466*a* and 466*b*, respectively. The electrical interconnects 460*a* and 460*b* may be formed using any of a number of coating techniques, such as electrolytic plating or plugging a paste composed of the electrically conductive material. The electrical interconnects 460*a* and 460*b* may be formed using the same types of materials as previously described for the electrical interconnects 260*a* and 260*b*.

Next, as illustrated in FIG. 4L, the photoresist layer 414 is stripped to expose the upper surface 234 of the dielectric layer 230, the plating layers 256*a* and 256*b*, and lateral surfaces 464*a* and 464*b* of the electrical interconnects 460*a* and 460*b*, respectively. At this stage prior to connection to any semiconductor device 202, an interconnection structure 420 (or redistribution structure 420) has been formed that includes the patterned conductive layer 250 and the electrical interconnects 460*a* and 460*b*. Again prior to connection to any semiconductor device 202, the interconnection structure 420 can be tested, including testing of the patterned conductive layer 250 and the electrical interconnects 460*a* and 460*b*. As a result, the semiconductor device 202 will be attached to an interconnection structure (or redistribution structure) that has acceptable performance (such as illustrated in FIG. 4M). This is advantageous because the removal of defective interconnection structures can prevent or reduce loss of semiconductor devices 202 resulting from yield loss in manufacturing of the interconnection structures, such as yield loss due to incorrect patterning.

Next, as illustrated in FIG. 4M, the semiconductor device 202 is attached to the structure 420. The semiconductor device 202 may be flip-chip bonded such that the semiconductor device 202 is electrically connected to the patterned conductive layer 250 and the electrical interconnects 460*a* and 460*b* via the connectors 212*a* and 212*b*. As described previously, in one embodiment, the underfill layer 213 may optionally be added between the lower surface 204 of the semiconductor device 202 and the dielectric layer 230.

Next, as illustrated in FIG. 4N, a pre-treated dielectric layer 422 is formed by forming openings 424*a*-424*d* in a dielectric material. The pre-treated dielectric layer 422 may be formed using the same types of materials as previously described for the dielectric layer 230. The openings 424*a*-424*d* may be through-holes formed using mechanical drilling. Alternatively, the openings 424*a*-424*d* may be formed using laser drilling. One or more of the openings 424*a*-424*d*, such as the openings 424*a* and 424*d*, may correspond to the openings 215*a* and 215*b* in the dielectric layer 214. In particular, the openings 424 and the openings 215 can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 4O, the dielectric layer 214 is formed adjacent to the upper surface 234 of the dielectric layer 230, the upper surface 206 and the lateral surfaces 208 and 210 of the semiconductor device 202, and the lateral surfaces 464*a* and 464*b* of the electrical interconnects 460*a* and 460*b*, respectively. In one embodiment, the dielectric layer 214 may be created by laminating the pretreated dielectric layer 422 on the upper surface 234 of the dielectric layer 230, the semiconductor device 202, and the lateral surfaces 464*a* and 464*b* of the electrical interconnects 460*a* and 460*b*, respectively. The dielectric layer 214 may be formed using the same types of materials as previously described for the dielectric layer 230.

FIG. 4E through FIG. 4I correspond to embodiments in which the semiconductor device 202 is flip-chip bonded. In other embodiments, the semiconductor device 202 may be wire bonded. In these other embodiments, the dielectric layers 230 (FIG. 4F to FIG. 4I) and 430 (FIG. 4E) may not be needed. For example, the patterned conductive layer 250 may be formed so that the semiconductor device 202 can be disposed adjacent to the patterned conductive layer 250. Alternatively, a die pad (not shown) may be formed adjacent to or near the patterned conductive layer 250, and the semiconductor device 202 may be disposed adjacent to the die pad.

In addition, the forming of openings 424 in the pre-treated dielectric layer 422 illustrated in FIG. 4N may not be needed. Instead, a liquid dielectric material may be used to form the dielectric layer 214 (FIG. 4O), such as in embodiments in which the semiconductor device 202 is wire bonded.

Next, as illustrated in FIGS. 4O and 4P, a height 470*a* and 470*b* of the electrical interconnects 460*a* and 460*b*, respectively, may be reduced to form the electrical interconnects 260*a* and 260*b*. In one embodiment, the upper surfaces 466*a* and 466*b* of the electrical interconnects 460*a* and 460*b* may be ground to form the electrical interconnects 260*a* and 260*b*. After grinding, the upper surfaces 266*a* and 266*b* of the electrical interconnects 260*a* and 260*b* may be substantially coplanar with the upper surface 218 of the dielectric layer 214. The upper surfaces 266*a* and 266*b* may be substantially smooth, or may be roughly textured.

As illustrated in FIG. 4P, the semiconductor device 202 may be disposed such that the upper surface 206 and the lower surface 204 of the semiconductor device 202 are between a first plane defined by the upper surfaces 266*a* and/or 266*b*, and a second plane defined by the first surfaces 253*a* and/or 253*b*.

Advantageously, the dielectric layer 214 is not a preformed core with an established thickness independent of semiconductor device height. Instead, the dielectric layer 214 has a thickness 472 that is adaptable depending on a height 474 of the semiconductor device 202. The adaptable thickness 472 enables the height 296 of the embedded component substrate 200 (shown in FIG. 2) to be set based on the height 474, so that the height 296 can become smaller for semiconductor devices 202 with smaller height 474. The thickness 472 of the dielectric layer 214 may be controllable to a tolerance in the tens of microns (μm), such as 10 microns, 20 microns, 30 microns, 40 microns, 50 microns, or 60 microns. The thickness 472 may be controlled so that a distance 476 between the upper surface 206 of the semiconductor device 202 and the upper surface 218 of the dielectric layer 214 is approximately a multiple of the tolerance value, such as 10 microns, 20 microns, 30 microns, 40 microns, 50 microns, 60 microns, 90 microns, or 120 microns. One way of controlling the thickness 472 is to control the size of the openings 424a-424d formed in the pre-treated dielectric layer 422 so that the pre-treated dielectric layer 422 contains an amount of dielectric material that will result in the formation of the dielectric layer 214 with the thickness 472.

Next, as illustrated in FIG. 4Q, the patterned conductive layer 240 is formed adjacent to the upper surface 218 of the dielectric layer 214. Included in the patterned conductive layer 240 are the electrical interconnects 241a and 241b, which are adjacent to the upper surfaces 266a and 266b of the electrical interconnects 260a and 260b, respectively. The patterned conductive layer 240 can be formed in a manner substantially similar to the process described in FIG. 5I through FIG. 5M.

Next, as illustrated in FIGS. 4R and 4S, the carrier 400 is removed, exposing a surface 426 of the electrically conductive layer 402 that is opposite the upper surface 404 of the electrically conductive layer 402. The electrically conductive layer 402 is then removed, exposing the patterned conductive layer 250 and portions of the lower surface 232 of the dielectric layer 230. The electrically conductive layer 402 may be removed by chemical etching.

Next, as illustrated in FIG. 4T, the protection layer 280 is formed adjacent to at least a portion of the upper surface 244 of the patterned conductive layer 240 and the upper surface 218 of the dielectric layer 214. The protection layer 284 is formed adjacent to at least a portion of the lower surface 254 of the patterned conductive layer 250 and the lower surface 232 of the dielectric layer 230. While one protection layer 280 and one protection layer 284 is illustrated in FIG. 4M, it is contemplated that more or less protection layers can be included for other implementations. The openings 282a and 282b in the protection layer 280 may expose portions of the electrically conductive layer 240, such as the electrical interconnects 241a and 241b. The openings 282a and 282b may also be aligned with the upper surfaces 245a and 245b of the electrical interconnects 241a and 241b, respectively. The openings 286a and 286b in the protection layer 284 may expose portions of the electrically conductive layer 250, such as the electrical interconnects 251a and 251b. The openings 286a and 286b may also be aligned with the lower surfaces 255a and 255b of the electrical interconnects 251a and 251b, respectively. The protection layers 280 and 284 may be patterned to form the openings 282a, 282b, 286a, and 286b, similar to the patterning of the dielectric layer 230 described previously.

Next, as illustrated in FIG. 2, the metal finish 290a and 290b is applied to the electrical interconnects 241a and 241b, respectively, and the metal finish 292a and 292b is applied to the electrical interconnects 251a and 251b, respectively. The metal finish layers 290a, 290b, 292a, and 292b may be formed using any of the techniques described previously for FIG. 4C.

Figure 5A:
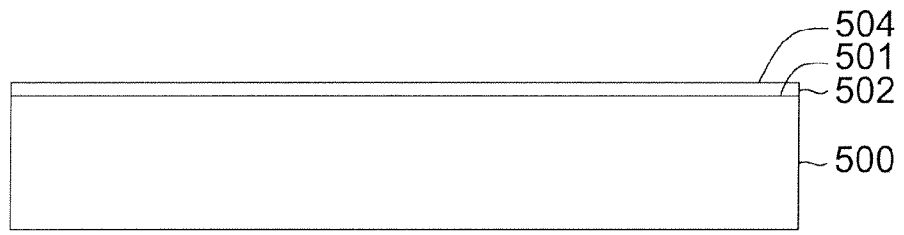
FIG. 5A through FIG. 5P illustrate a method of forming the embedded component substrate of FIG. 3, according to another embodiment of the invention.
Figure 5B:
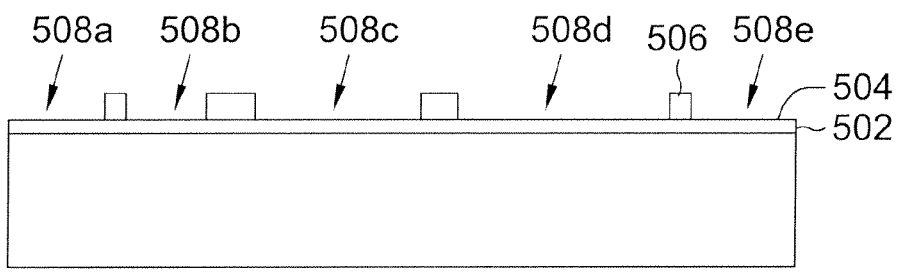
Figure 5C:
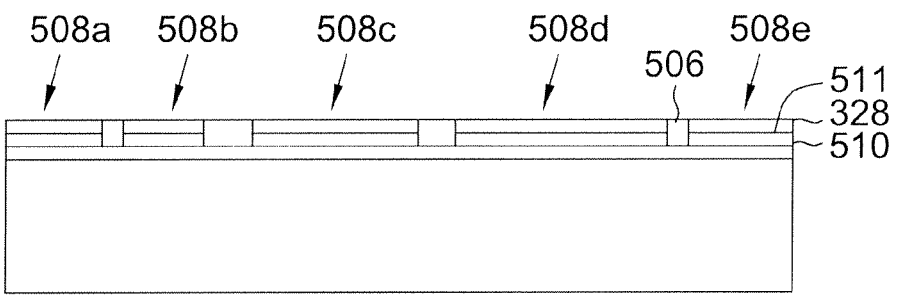
Figure 5D:
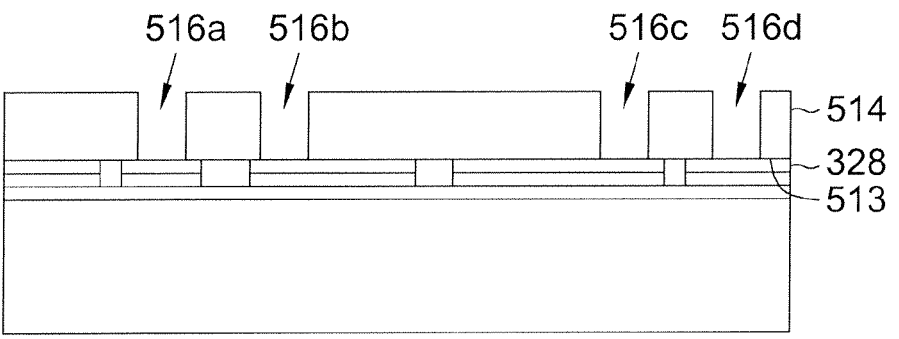
Figure 5E:
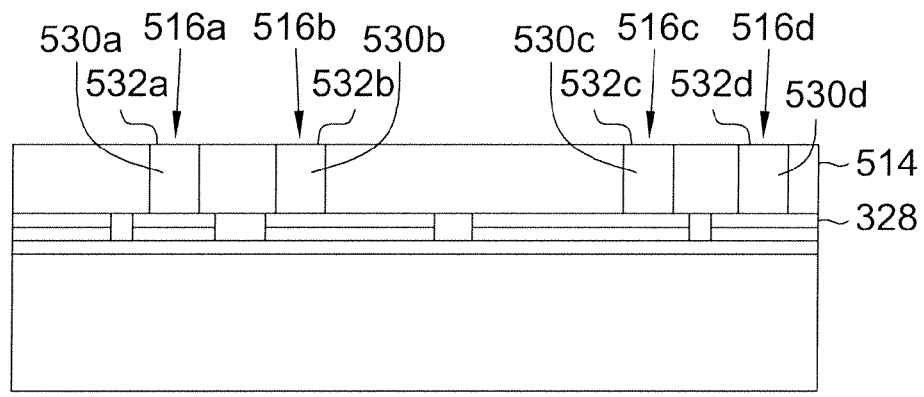
Figure 5F:
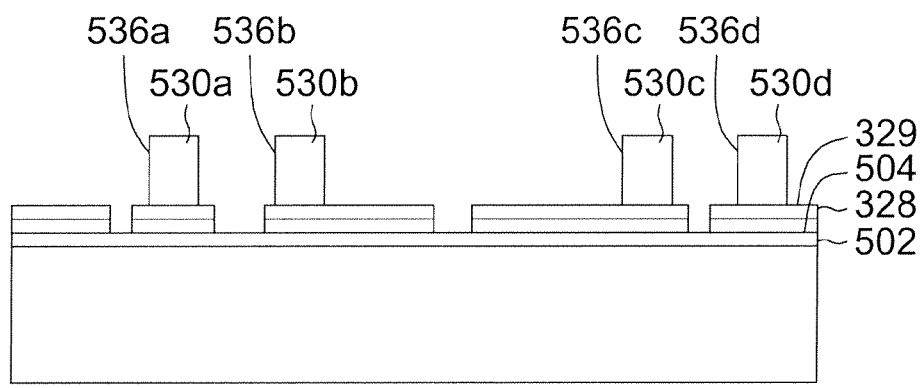
Figure 5G:
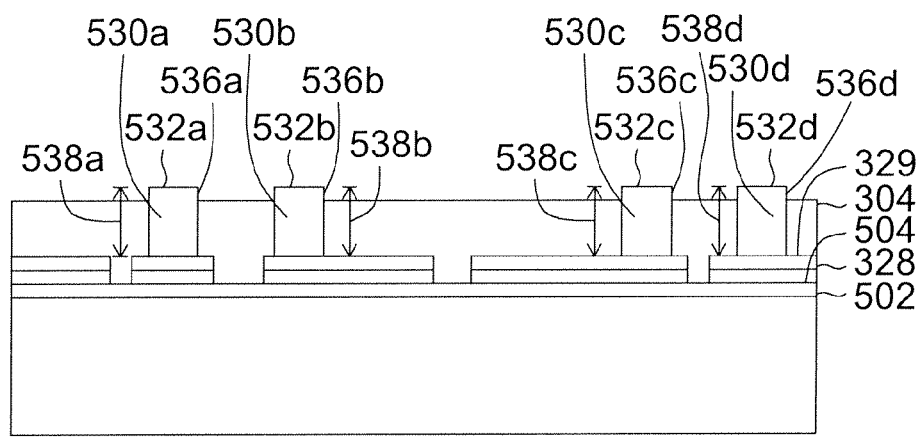
Figure 5H:
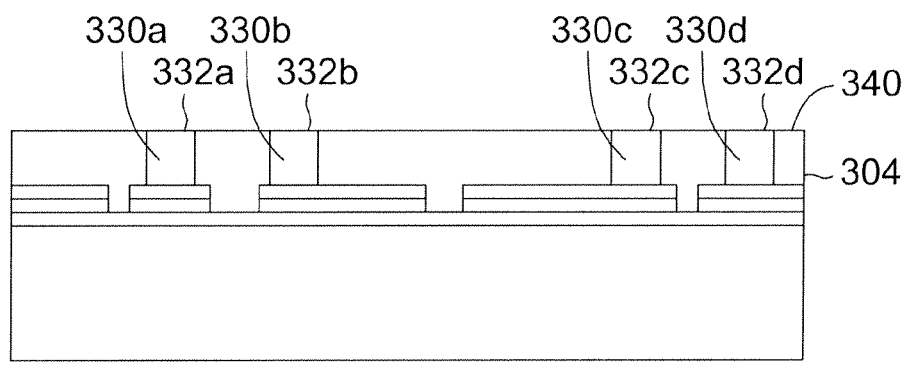
Figure 5I:
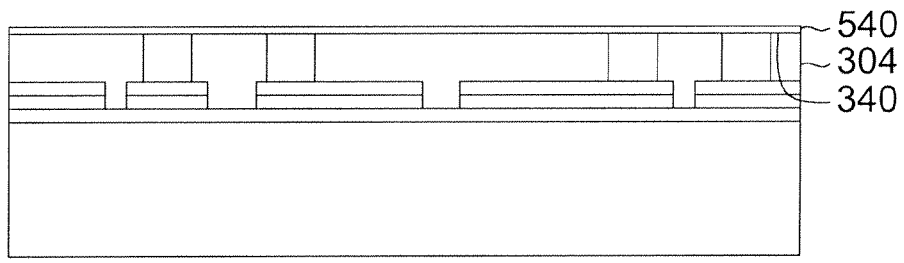
Figure 5J:
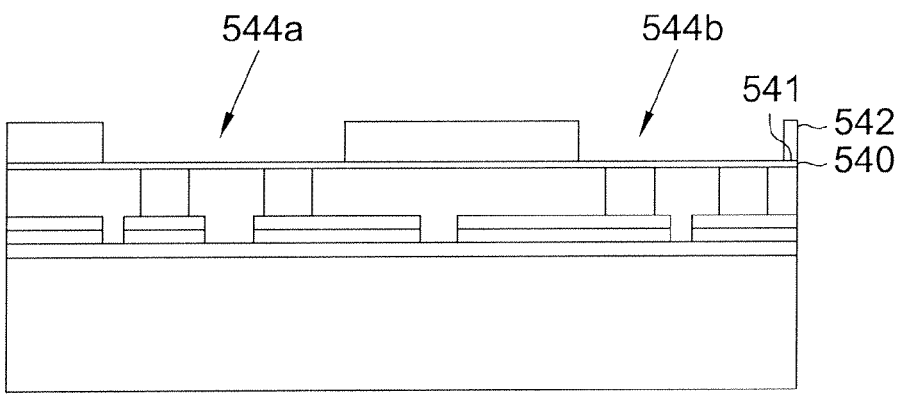
Figure 5K:
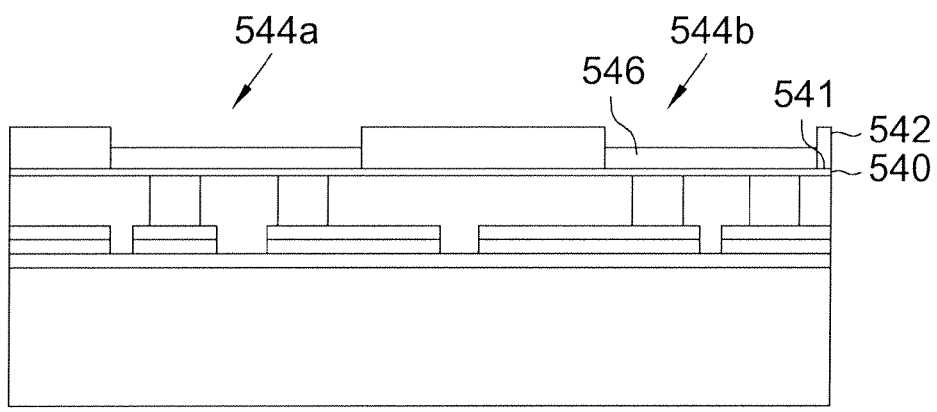
Figure 5L:
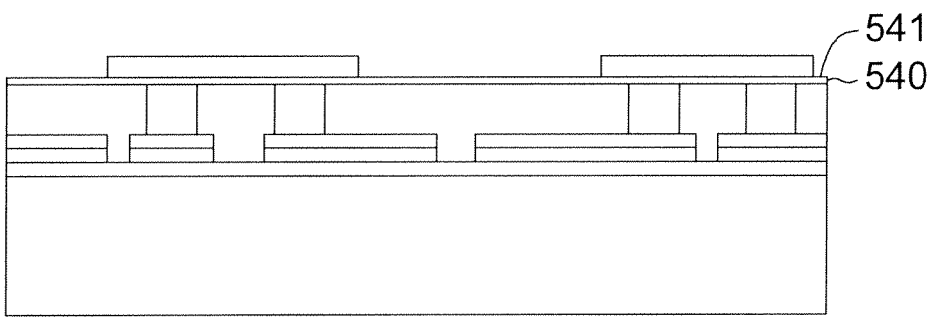
Figure 5M:
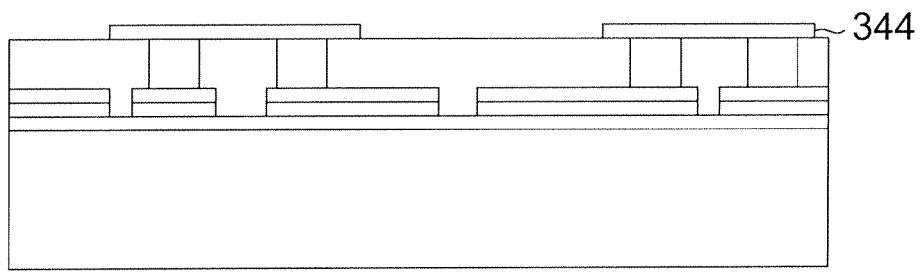
Figure 5N:
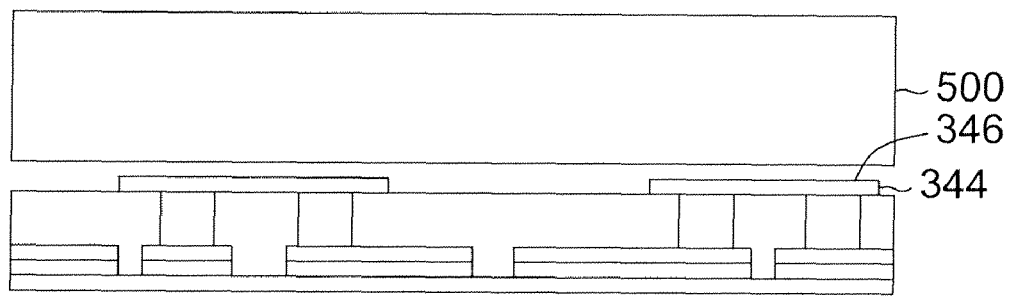
Figure 5O:
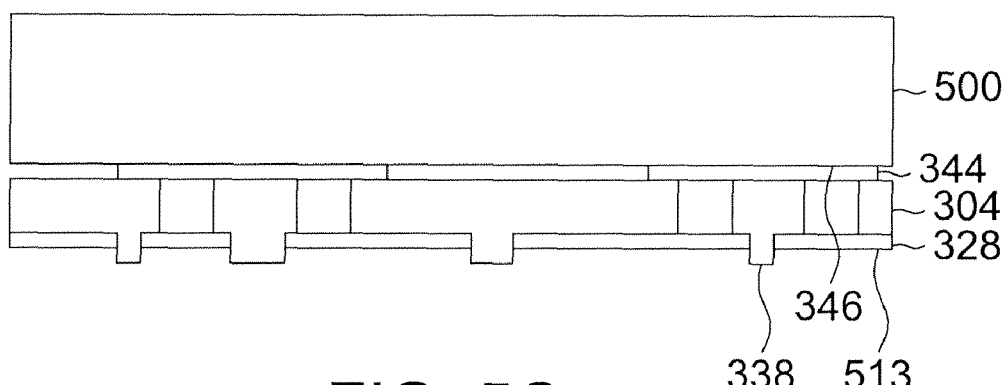
Figure 5P:
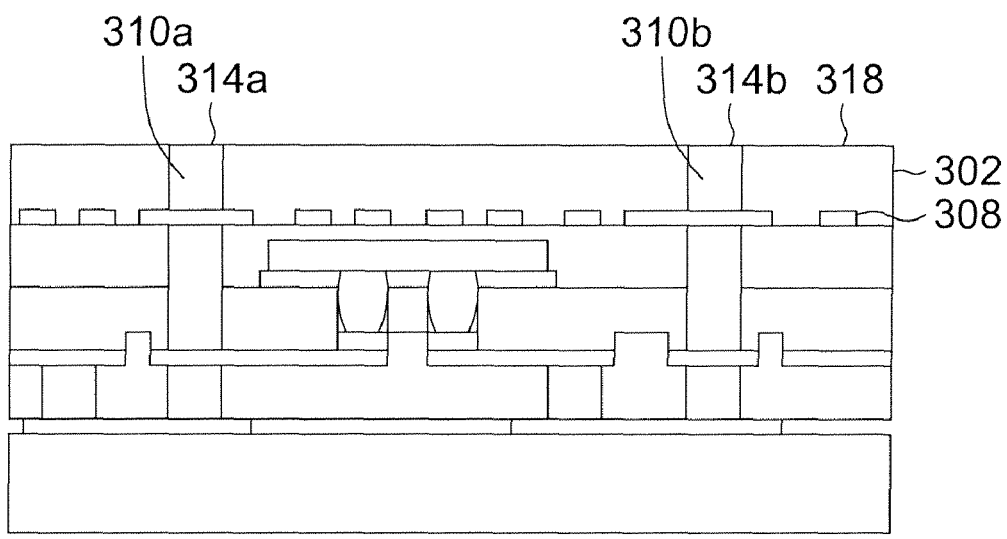

FIG. 5A through FIG. 5P illustrate a method of forming the embedded component substrate 300 of FIG. 3, according to another embodiment of the invention. For ease of presentation, the following manufacturing operations are described with reference to the embedded component substrate 300 of FIG. 3. However, it is contemplated that the manufacturing operations can be similarly carried out to form other embedded component substrates that may have different internal structure from the embedded component substrate 300. In addition, it is contemplated that the manufacturing operations can be similarly carried out to form an embedded component substrate that includes multiple copies of the embedded component substrate 300 connected together, so that singulation of the embedded component substrate may result in the generation of multiple embedded component substrates 300.

Referring first to FIG. 5A, a carrier 500 is provided, and an electrically conductive layer 502 is disposed adjacent to an upper surface 501 of the carrier 500. The electrically conductive layer 502 has an upper surface 504. The electrically conductive layer 502 may be formed from a metal, a metal alloy, a matrix with a metal or a metal alloy dispersed therein, or another suitable electrically conductive material. For example, the electrically conductive layer 502 may include a metallic foil formed from copper or an alloy including copper. The electrically conductive layer 502 may be attached to the carrier 500 with a tape (not shown) disposed adjacent to the upper surface 501 of the carrier 500. The tape, which can be implemented as a single-sided or double-sided adhesive tape, secures components at an appropriate spacing with respect to one another, and allows subsequent manufacturing operations to be carried out with those components disposed adjacent to the carrier 400.

Next, as illustrated in FIG. 5B, a photoresist material may be applied to the upper surface 504 of the electrically conductive layer 502 to folio a photoresist layer 506 adjacent to the upper surface 504. The photoresist layer 506 includes openings 508a-508e. The photoresist layer 506 is formed in a similar way to the photoresist layer 406, and the openings 508a-508e have similar characteristics to those of the openings 408a-408e (described along with FIG. 4B).

Next, as illustrated in FIG. 5C, an electrically conductive material is applied into the openings, including openings 508a-508e, defined by the photoresist layer 506 to form a patterned conductive layer 510. The patterned conductive layer 510 may be formed using any of a number of coating techniques, such as chemical vapor deposition, electroless plating, electrolytic plating, printing, spinning, spraying, sputtering, or vacuum deposition. The patterned conductive layer 510 may be formed from a metal, a metal alloy, a matrix with a metal or a metal alloy dispersed therein, or another suitable electrically conductive material. The patterned conductive layer 510 may be formed of an electrically conductive material different from that used to form the conductive layer 502. For example, the electrically conductive layer 502 may include a metallic foil formed from copper or an alloy including copper.

Next, as also illustrated in FIG. 5C, an electrically conductive material is applied into the openings, including openings 508a-508e, defined by the photoresist layer 506 to form the patterned conductive layer 328 adjacent to an upper surface 511 of the patterned conductive layer 510. The patterned conductive layer 328 may be formed using any of a number of coating techniques, such as chemical vapor deposition, electroless plating, electrolytic plating, printing, spinning, spraying, sputtering, or vacuum deposition. The patterned conductive layer 328 may be formed from a metal, a metal alloy, a matrix with a metal or a metal alloy dispersed therein, or another suitable electrically conductive material. The patterned conductive layer 328 may be formed of an electrically conductive material different from that used to form the patterned conductive layer 510. For example, the patterned conductive layer 328 may include a metallic foil formed from copper or an alloy including copper.

Next, as illustrated in FIG. 5D, a photoresist material may be applied to an upper surface 513 of the electrically conductive layer 328 to form a photoresist layer 514 adjacent to the upper surface 513 and adjacent to the photoresist layer 506.

The photoresist layer 514 includes openings 516a-516d. The photoresist layer 514 is formed in a similar way to the photoresist layer 406, and the openings 516a-516d have similar characteristics to those of the openings 408a-408e (described along with FIG. 4B).

Next, as illustrated in FIG. 5E, an electrically conductive material is applied into the openings 516a-516d defined by the photoresist layer 514 to form electrical interconnects 530a-530d, respectively. The electrical interconnects 530a-530d may be formed extending substantially vertically away from the electrically conductive layer 328. The electrical interconnects 530a-530d may substantially fill the openings 516a-516d, respectively. The electrical interconnects 530a-530d include upper surfaces 532a-532d, respectively. The electrical interconnects 530a-530d may be formed using any of a number of coating techniques, such as electrolytic plating or plugging a paste composed of the electrically conductive material. The electrical interconnects 530a-530d may be formed using the same types of materials as previously described for the electrical interconnects 260a and 260b (described along with FIGS. 2 and 4).

Next, as illustrated in FIG. 5F, the photoresist layers 506 and 514 are stripped to expose the lower surface 329 of the electrically conductive layer 328 (in an inverted orientation during manufacturing operations), lateral surfaces 536a-536d of the electrical interconnects 530a-530d, and portions of the upper surface 504 of the electrically conductive layer 502.

Next, a pre-treated dielectric layer is formed, similar to the description of FIG. 4N. Next, as illustrated in FIG. 5G, the dielectric layer 304 is formed adjacent to the lower surface 329 of the electrically conductive layer 328 (in an inverted orientation during manufacturing operations), portions of the lateral surfaces 536a-536d of the electrical interconnects 530a-530d, and portions of the upper surface 504 of the electrically conductive layer 502. In one embodiment, the dielectric layer 304 may be created by laminating the pre-treated dielectric layer (not shown) on the lower surface 329 of the electrically conductive layer 328 (in an inverted orientation during manufacturing operations), portions of the lateral surfaces 536a-536d of the electrical interconnects 530a-530d, and portions of the upper surface 504 of the electrically conductive layer 502. The dielectric layer 304 may be formed using the same types of materials as previously described for the dielectric layer 230 (described along with FIGS. 2 and 4).

Next, as illustrated in FIGS. 5G and 5H, heights 538a-538d of the electrical interconnects 530a-530d, respectively, may be reduced to form the electrical interconnects 330a-330d. In one embodiment, the upper surfaces 532a-532d of the electrical interconnects 530a-530d may be ground to form the electrical interconnects 330a-330d, and the corresponding lower surfaces 332a-332d (in an inverted orientation during manufacturing operations). After grinding, the lower surfaces 332a-332d of the electrical interconnects 330a-330d may be substantially coplanar with the lower surface 340 of the dielectric layer 304 (in an inverted orientation during manufacturing operations). The lower surfaces 332a-332d may be substantially smooth, or may be roughly textured.

Next, as illustrated in FIG. 5I, an electrically conductive layer 540 is formed on the lower surface 340 of the dielectric layer 304 (in an inverted orientation during manufacturing operations). The electrically conductive layer 540 may be formed from a metal, a metal alloy, a matrix with a metal or a metal alloy dispersed therein, or another suitable electrically conductive material. For example, the electrically conductive layer 540 may include a metallic foil formed from copper or an alloy including copper. The electrically conductive layer 540 may be formed using any of a number of electroless coating techniques, such as chemical vapor deposition, electroless plating, printing, spinning, spraying, sputtering, or vacuum deposition.

Next, as illustrated in FIG. 5J, a photoresist material may be applied to an upper surface 541 of the electrically conductive layer 540 to form a photoresist layer 542 adjacent to the upper surface 541. The photoresist layer 542 includes openings 544a and 544b. The photoresist layer 542 is formed in a similar way to the photoresist layer 406, and the openings 544a and 544b have similar characteristics to those of the openings 408a-408e (described along with FIG. 4B).

Next, as illustrated in FIG. 5K, an electrically conductive material is applied into the openings, including openings 544a and 544b, defined by the photoresist layer 542 to form the patterned conductive layer 546 adjacent to the upper surface 541 of the electrically conductive layer 540. The patterned conductive layer 546 may be formed using any of a number of coating techniques, such as chemical vapor deposition, electroless plating, electrolytic plating, printing, spinning, spraying, sputtering, or vacuum deposition. The patterned conductive layer 546 may be formed from a metal, a metal alloy, a matrix with a metal or a metal alloy dispersed therein, or another suitable electrically conductive material. For example, the patterned conductive layer 546 may include a metallic foil formed from copper or an alloy including copper.

Next, as illustrated in FIG. 5L, the photoresist layer 542 is stripped to expose the upper surface 541 of the electrically conductive layer 540.

Next, as illustrated in FIG. 5M, portions of the electrically conductive layer 540 and the patterned conductive layer 546 are removed to form the patterned conductive layer 344. The patterned conductive layer 344 may be formed using any of a number of metal removal techniques, such as chemical etching and/or flash etching.

Next, as illustrated in FIG. 5N and FIG. 5O, the carrier 500 is separated from the electrically conductive layer 502. The carrier 500 is then re-set so that the carrier 500 is attached to the lower surface 346 of the patterned conductive layer 344 (in an inverted orientation during manufacturing operations).

Next, as illustrated in FIG. 5O, the electrically conductive layer 502 and the electrically conductive layer 510 are removed to expose an upper surface 513 of the patterned conductive layer 328, and portions of the upper surface 338 of the dielectric layer 304 (in an inverted orientation during manufacturing operations).

Next, the two-layer structure 306 and the patterned conductive layer 308 can be formed in a manner substantially similar to the process described in FIG. 4E through FIG. 4O.

Next, as illustrated in FIG. 5P, the electrical interconnects 310a and 310b and the dielectric layer 302 may be formed in a manner substantially similar to the process described in FIG. 5D to FIG. 5H, such that the electrical interconnects 310a and 310b extend substantially vertically away from the electrically conductive layer 308. The upper surfaces 314a and 314b of the electrical interconnects 310a and 310b, respectively, may be substantially coplanar with the upper surface 318 of the dielectric layer 302.

Next, as illustrated in FIG. 3, the patterned conductive layer 324 may be formed adjacent to the upper surface 318 of the dielectric layer 302, and adjacent to the upper surfaces 314a and 314b of the electrical interconnects 310a and 310b, respectively. The patterned conductive layer 324 can be formed in a manner substantially similar to the process described in FIG. 5I through FIG. 5M. In addition, the protection layer 350, including the openings 362a-362d, may be formed in a manner substantially similar to the process described in FIG. 4T. The protection layer 352, including the openings 364a and 364b, may also be formed in a manner substantially similar to the process described in FIG. 4T.

Next, as illustrated in FIG. 3, the metal finish 354 is applied to the portions of the upper surface 326 of the patterned conductive layer 324 exposed by the openings 362a-362d, and the metal finish 356 is applied to the portions of the lower surface 346 of the patterned conductive layer 344 exposed by the openings 364a and 364b. The metal finish layers 354 and 356 may be formed using any of the techniques described previously for FIG. 4C.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An embedded semiconductor device, comprising:
   a first dielectric;
   a first patterned conductive layer disposed on the first dielectric, wherein the first dielectric defines a first opening aligned with at least a portion of the first patterned conductive layer;
   a second patterned conductive layer overlying the first patterned conductive layer;
   an electrical interconnect extending from the first patterned conductive layer to the second patterned conductive layer;
   a second dielectric defining a second opening extending from the first patterned conductive layer to the second patterned conductive layer, wherein the electrical interconnect substantially fills the second opening; and
   a semiconductor device having an upper surface, lateral surfaces, and an active surface opposite the upper surface, wherein:
      the upper surface and the lateral surfaces of the semiconductor device are substantially covered by the second dielectric; and
      the semiconductor device is disposed between the first patterned conductive layer and the second patterned conductive layer;
   wherein the second dielectric includes:
      a first dielectric layer that substantially covers the upper surface and the lateral surfaces of the semiconductor device, and that defines a first portion of the second opening; and
      a second dielectric layer that is disposed adjacent to the active surface of the semiconductor device, and that defines a second portion of the second opening.

2. The embedded semiconductor device of claim 1, wherein the second dielectric substantially covers at least a portion of a lateral surface of the electrical interconnect.

3. The embedded semiconductor device of claim 1, wherein the first portion of the second opening is aligned with the second portion of the second opening.

4. The embedded semiconductor device of claim 3, wherein:
   the second dielectric layer further defines a third opening extending through the second dielectric layer; and
   the third opening is aligned with a contact pad of the semiconductor device.

5. The embedded semiconductor device of claim 3, wherein the electrical interconnect is a single continuous structure extending from the first patterned conductive layer to the second patterned conductive layer.

6. The embedded semiconductor device of claim 1, wherein:
   the first opening exposes part of a lower surface of the first patterned conductive layer; and
   a first portion of the second patterned conductive layer is disposed on the second dielectric, and a second portion of the second patterned conductive layer is disposed on the electrical interconnect.

7. The embedded semiconductor device of claim 6, wherein at least part of the first portion of the second patterned conductive layer is disposed within the periphery of the semiconductor device.

8. An embedded semiconductor device, comprising:
   a first dielectric layer defining a first opening;
   a second dielectric layer defining a second opening substantially aligned with the first opening;
   an upper conductive layer disposed adjacent to the first opening;
   a lower conductive layer disposed adjacent to the second opening, wherein the first dielectric layer and the second dielectric layer are disposed between the upper conductive layer and the lower conductive layer;
   at least one electrical interconnect extending from the lower conductive layer to the upper conductive layer and substantially filling the first opening in the first dielectric layer and the second opening in the second dielectric layer, wherein the electrical interconnect is a single continuous structure; and
   a semiconductor device embedded in the first dielectric layer and electrically connected to the electrical interconnect via the lower conductive layer.

9. The embedded semiconductor device of claim 8, wherein:
   the semiconductor device has an upper surface, lateral surfaces, and an active surface opposite the upper surface;
   the first dielectric layer substantially covers the upper surface and the lateral surfaces of the semiconductor device; and
   the second dielectric layer is disposed adjacent to the active surface of the semiconductor device.

10. The embedded semiconductor device of claim 8, wherein the first dielectric layer includes a dielectric material that substantially covers a portion of a lateral surface of the electrical interconnect.

11. The embedded semiconductor device of claim 8, wherein:
   a portion of the first dielectric layer is disposed between an upper surface of the semiconductor device and the upper conductive layer; and
   a portion of the upper conductive layer is disposed on the first dielectric layer.

12. The embedded semiconductor device of claim 8, further comprising a plurality of electrical interconnects extending from the lower conductive layer to the upper conductive layer and disposed around the semiconductor device.

13. The embedded semiconductor device of claim 8, wherein the first dielectric layer and the second dielectric layer are formed from different materials.

14. The embedded semiconductor device of claim 8, wherein the lower conductive layer and the upper conductive layer further comprise exposed electrical interconnects for electrical connection external to the embedded semiconductor device.

15. An embedded semiconductor device, comprising:
a first conductive layer;
a second conductive layer;
a semiconductor device disposed between and electrically connected to the first conductive layer and the second conductive layer, the semiconductor device having an upper surface, lateral surfaces, and an active surface opposite the upper surface;
a dielectric encapsulating the upper surface and the lateral surfaces of the semiconductor device, wherein a portion of the dielectric is disposed between the upper surface of the semiconductor device and the second conductive layer, and wherein the dielectric defines an opening; and
an electrical interconnect extending through the opening to connect the first conductive layer to the second conductive layer;
wherein a portion of the second conductive layer is disposed on the portion of the dielectric and within a periphery of the semiconductor device, and a portion of the first conductive layer is exposed for electrical connection external to the embedded semiconductor device, wherein the dielectric includes:
a first dielectric portion that substantially covers at least the upper surface and the lateral surfaces of the semiconductor device, and that defines a first portion of the opening; and
a second dielectric portion that is disposed adjacent to the active surface of the semiconductor device, and that defines a second portion of the opening.

16. The embedded semiconductor device of claim 15, wherein the electrical interconnect substantially fills the opening.

17. The embedded semiconductor device of claim 15, wherein the first portion of the opening is aligned with the second portion of the opening.

18. The embedded semiconductor device of claim 17, wherein the electrical interconnect substantially fills the first portion of the opening and the second portion of the opening, and the electrical interconnect is a single continuous structure.

19. The embedded semiconductor device of claim 17, wherein the first dielectric portion and the second dielectric portion are formed from different materials.

20. The embedded semiconductor device of claim 15, wherein the dielectric substantially covers a portion of a lateral surface of the electrical interconnect.

* * * * *